(12) United States Patent
Tsubuku et al.

(10) Patent No.: US 8,860,023 B2
(45) Date of Patent: Oct. 14, 2014

(54) SEMICONDUCTOR DEVICE

(71) Applicant: Semiconductor Energy Laboratory Co., Ltd., Atsugi (JP)

(72) Inventors: Masashi Tsubuku, Atsugi (JP); Yusuke Nonaka, Isehara (JP); Noritaka Ishihara, Kawasaki (JP); Masashi Oota, Atsugi (JP); Hideyuki Kishida, Ashikaga (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/870,399

(22) Filed: Apr. 25, 2013

(65) Prior Publication Data
US 2013/0292675 A1    Nov. 7, 2013

(30) Foreign Application Priority Data

May 1, 2012 (JP) ................................. 2012-104858
Nov. 30, 2012 (JP) ................................. 2012-263065
Feb. 8, 2013 (JP) ................................. 2013-023631
Mar. 14, 2013 (JP) ................................. 2013-051611

(51) Int. Cl.
*H01L 29/786* (2006.01)
*H01L 29/24* (2006.01)

(52) U.S. Cl.
CPC .................................... *H01L 29/786* (2013.01)
USPC ......... 257/43; 257/57; 257/268; 257/E21.409; 257/E21.473; 257/E29.255; 257/E29.296; 438/104; 438/301

(58) Field of Classification Search
USPC ............ 257/43, 57, 288, E21.409, E21.473, 257/E29.255, E29.296; 438/104, 301
See application file for complete search history.

(56) References Cited

U.S. PATENT DOCUMENTS 5,731,856 A   3/1998 Kim et al.
5,744,864 A   4/1998 Cillessen et al.
(Continued)

FOREIGN PATENT DOCUMENTS

EP   1737044 A   12/2006
EP   2226847 A   9/2010
(Continued)

OTHER PUBLICATIONS

Ghaffarzadeh.K et al., "Persistent photoconductivity in Hf—In—Zn—O thin film transistors," Appl. Phys. Lett. (Applied Physics Letters), 2010, vol. 97, No. 14, pp. 143510-1-143510-3.

(Continued)

*Primary Examiner* — Dao H Nguyen
(74) *Attorney, Agent, or Firm* — Eric J. Robinson; Robinson Intellectual Property Law Office, P.C.

(57) ABSTRACT

Reducing hydrogen concentration in a channel formation region of an oxide semiconductor is important in stabilizing threshold voltage of a transistor including an oxide semiconductor and improving reliability. Hence, hydrogen is attracted from the oxide semiconductor and trapped in a region of an insulating film which overlaps with a source region and a drain region of the oxide semiconductor. Impurities such as argon, nitrogen, carbon, phosphorus, or boron are added to the region of the insulating film which overlaps with the source region and the drain region of the oxide semiconductor, thereby generating a defect. Hydrogen in the oxide semiconductor is attracted to the defect in the insulating film. The defect in the insulating film is stabilized by the presence of hydrogen.

17 Claims, 25 Drawing Sheets

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,003,981 B2 | 8/2011 | Iwasaki et al. |
| 8,164,090 B2 | 4/2012 | Iwasaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0065771 A1* | 3/2009 | Iwasaki et al. .................. 257/43 |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0018074 A1* | 1/2011 | Miyata .......................... 257/411 |
| 2011/0079778 A1 | 4/2011 | Yamazaki et al. |
| 2011/0254538 A1 | 10/2011 | Kato et al. |
| 2011/0256684 A1 | 10/2011 | Iwasaki et al. |
| 2012/0161121 A1 | 6/2012 | Yamazaki |
| 2012/0161122 A1 | 6/2012 | Yamazaki |
| 2012/0161123 A1 | 6/2012 | Yamazaki |
| 2012/0161124 A1 | 6/2012 | Yamazaki |
| 2012/0161125 A1 | 6/2012 | Yamazaki |
| 2012/0161126 A1 | 6/2012 | Yamazaki |
| 2012/0187396 A1* | 7/2012 | Yamazaki et al. ............... 257/43 |
| 2012/0228605 A1 | 9/2012 | Noda |
| 2012/0235137 A1* | 9/2012 | Koezuka et al. ................ 257/43 |
| 2012/0248433 A1* | 10/2012 | Nakano et al. .................. 257/43 |
| 2013/0193431 A1 | 8/2013 | Yamazaki |
| 2013/0193432 A1 | 8/2013 | Yamazaki |
| 2014/0073086 A1* | 3/2014 | Hosoba et al. ................. 438/104 |
| 2014/0113407 A1* | 4/2014 | Yamazaki et al. ............. 438/104 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-220816 A | 8/2007 |
| JP | 2007-250983 A | 9/2007 |
| JP | 2010-093070 A | 4/2010 |
| JP | 2011-100980 A | 5/2011 |
| JP | 2011-237418 A | 11/2011 |
| WO | WO-2004/114391 | 12/2004 |

OTHER PUBLICATIONS

Inoue.T et al., "New construction of photoconductivity and its spectral response in amorphous In—Ga—Zn—O," AM-FPD '10 Digest of Technical Papers, Jul. 5, 2010, pp. 33-36.

Lee.D et al., "Large Photoresponse in Amorphous In—Ga—Zn—O and Origin of Reversible and Slow Decay," Electrochemical and Solid-State Letters, 2010, vol. 13, No. 9, pp. H324-H327.

(56) References Cited

OTHER PUBLICATIONS

Munekuni.S et al., "Various types of nonbridging oxygen hole center in high-purity silica glass," J. Appl. Phys. (Journal of Applied Physics), Aug. 1, 1990, vol. 68, No. 3, pp. 1212-1217.

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the $In_2O_3$—$Ga_2ZnO_4$—ZnO system at 1350° C,", Journal of Solid State Chemistry, Aug. 1, 1991, vol. 93, No. 2, pp. 298-315.

Kimizuka.N. et al., "Syntheses and Single-Crystal Data of Homologous Compounds, $In_2O_3(ZnO)_m$ (m = 3, 4, and 5), $InGaO_3(ZnO)_3$, and $Ga_2O_3(ZnO)_m$ (m = 7, 8, 9, and 16) in the $In_2O_3$—$ZnGa_2O_4$—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N. et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)_5$ films,", Appl. Phys. Lett. (Applied Physics Letters), Sep. 13, 2004, vol. 85, No. 11, pp. 1993-1995.

Li.C et al., "Modulated Structures of Homologous Compounds $InMO_3(ZnO)_m$ (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MOO_3$ As a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID

(56) References Cited

OTHER PUBLICATIONS

Digest '09 : SID International Symposium Digest of Technical Papers, May 31, 2009, pp. 1110-1112.
Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.
Miyasaka.M, "SUFTLA Flexible Microelectronics on Their Way to Business,", SID Digest '07.: SID International Symposium Digest of Technical Papers, 2007, vol. 38, pp. 1673-1676.
Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.
Asaoka.Y at al., "29.1: Polarizer-Free Reflective LCD Combined With Ultra Low-Power Driving Technology,", SID Digest '09 : SID International Symposium Digest of Technical Papers, May 31, 2009, pp. 395-398.
Lee.H et al., "Current Status of, Challenges to, and Perspective View of AM-OLED ,", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.
Nakamura.M, "Synthesis of Homologous Compound with New Long-Period Structure,", NIRIM Newsletter, Mar. 1, 1995, vol. 150, pp.1-4.
Kikuchi.H et al., "Polymer-Stabilized Liquid Crystal Blue Phases,", Nature Materials, Sep. 2, 2002, vol. 1, pp. 64-68.
Kimizuka.N et al., "Spinel, YBFE2O4, and YB2FE3O7 Types of Structures for Compounds in the In2O3 and Sc2O3—A2O3—Bo Systems [A; Fe, Ga, Or Al; B: Mg, Mn, Fe, Ni, Cu, or Zn] at Temperatures Over 1000° C,", Journal of Solid State Chemistry, 1985, vol. 60, pp. 382-384.
Kitzerow.H at al., "Observation of Blue Phases in Chiral Networks,", Liquid Crystals, 1993, vol. 14, No. 3, pp. 911-916.
Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.
Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.
Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.
Orita.M et al., "Mechanism of Electrical Conductivity of Transparent InGaZnO4,", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.
Janotti.A et al., "Native Point Defects in ZnO,", Phys. Rev. B (Physical Review. B), Oct. 4, 2007, vol. 76, No. 16, pp. 165202-1-165202-22.
Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.
Janotti.A et al., "Oxygen Vacancies in ZnO,", Appl. Phys. Lett. (Applied Physics Letters) , 2005, vol. 87, pp. 122102-1-122102-3.
Oba.F et al., "Defect energetics in ZnO: A hybrid Hartree-Fock density functional study,", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor,", Philosophical Magazine, 2001, vol. 81, No. 5, pp. 501-515.
Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays,", IDW '08 : Proceedings of the 6th International Display Workshops, Dec. 3, 2008, pp. 581-584.
Kim.S et al., "High-Performance oxide thin film transistors passivated by various gas plasmas,", 214th ECS Meeting, 2008, No. 2317, ECS.
Clark.S et al., "First Principles Methods Using CASTEP,", Zeitschrift fur Kristallographie, 2005, vol. 220, pp. 567-570.
Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.
Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.
Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.
Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

* cited by examiner

FIG. 9A1 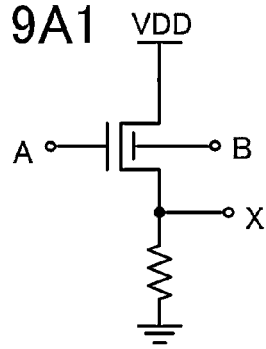
FIG. 9A2 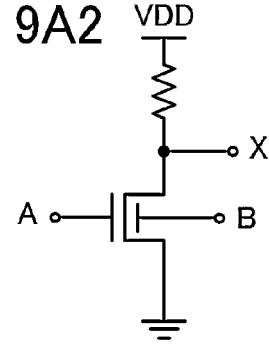

FIG. 9C1 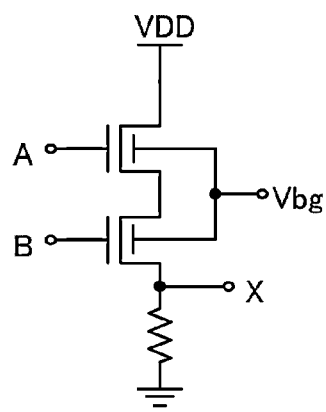
FIG. 9C2 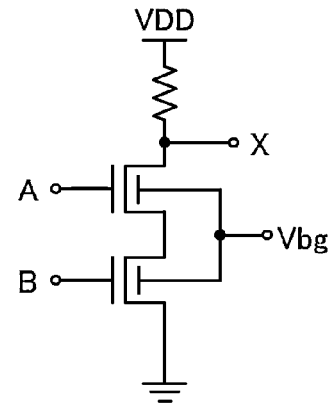

ΔVth=-0.89V

ΔVth=0.02V

SEMICONDUCTOR DEVICE

BACKGROUND OF THE INVENTION

1. Field of the Invention

The present invention relates to an object, a method, or a manufacturing method. Further, the present invention relates to a process, a machine, manufacture, or a composition of matter. In particular, the present invention relates to a semiconductor device, a display device, a light-emitting device, a method for driving any of them, or a method for manufacturing any of them, for example. In particular, the present invention relates to a semiconductor device including an oxide semiconductor, a display device including an oxide semiconductor, or a light-emitting device including an oxide semiconductor, for example.

Note that in this specification, a "semiconductor device" generally refers to a device which can function by utilizing semiconductor characteristics; an electrooptic device, a light-emitting display device, a semiconductor circuit, and an electronic device are all included in semiconductor devices.

2. Description of the Related Art

A technique by which transistors are formed using semiconductor thin films formed over a substrate having an insulating surface has been attracting attention. The transistor is applied to a wide range of electronic devices such as an integrated circuit (IC) or an image display device (display device). A silicon-based semiconductor material is widely known as a material for a semiconductor thin film applicable to a transistor. As another material, an oxide semiconductor has been attracting attention.

For example, Patent Document 1 discloses a transistor in which an amorphous oxide semiconductor film containing indium (In), gallium (Ga), and zinc (Zn) is used as an active layer and regions of the oxide semiconductor film to which hydrogen is added are included as a source region and a drain region.

Further, Patent Document 2 discloses a transistor in which regions of an amorphous oxide semiconductor film to which nitrogen is added are included as a source region and a drain region.

REFERENCE

[Patent Document 1] Japanese Published Patent Application No. 2007-250983
[Patent Document 2] Japanese Published Patent Application No. 2010-093070
[Patent Document 3] Japanese Published Patent Application No. 2011-100980
[Patent Document 4] Japanese Published Patent Application No. 2011-237418
[Non-patent Document 1] D. H. Lee et al., Electrochemical and Solid State letters, 13 (2010) H324-H327
[Non-patent Document 2] T. Inoue et al., Proc. AM-FPD'10 Digest, 33 (2010)
[Non-patent Document 3] K. Graffarzadah et al., APPLIED PHYSICS LETTERS 97 143510 (2010)
[Non-patent Document 4] S. Munekuni et al., J. Appl. Phys. 68 1212 (1990)

SUMMARY OF THE INVENTION

However, in an oxide semiconductor, oxygen vacancies and hydrogen partly serve as a donor to generate electrons that are carriers. When the carrier density in an oxide semiconductor film becomes high, a channel is formed in a transistor without voltage application to a gate, leading to a shift of threshold voltage in the negative direction.

In view of the above-described problem, an object of one embodiment of the present invention is to provide a transistor or the like with stable threshold voltage, which includes an oxide semiconductor. Another object of one embodiment of the present invention is to provide a semiconductor device or the like with improved reliability, which has a transistor including an oxide semiconductor.

Another object of one embodiment of the present invention is to provide a novel semiconductor device or the like.

Note that the descriptions of these objects do not disturb the existence of other objects. Note that in one embodiment of the present invention, there is no need to achieve all the objects. Other objects will be apparent from and can be derived from the description of the specification, the drawings, the claims, and the like.

In order to achieve any of the above objects, it is important to reduce hydrogen concentration in a channel formation region of an oxide semiconductor. In one embodiment of the present invention, as one method for reducing hydrogen concentration, hydrogen is attracted to and trapped in an insulating film in contact with an oxide semiconductor (such action can also be called intrinsic gettering). Here, the insulating film in contact with the oxide semiconductor is a gate insulating film, a base insulating film, a protective insulating film, or the like.

Hydrogen in the oxide semiconductor can be attracted to and trapped in the insulating film in contact with the oxide semiconductor if hydrogen existing in the insulating film in contact with the oxide semiconductor is more stable than hydrogen existing in the oxide semiconductor.

In order to obtain the above-described state, it is effective to generate a defect in the insulating film in contact with the oxide semiconductor. It is disclosed in Table 2 or the like in Japanese Patent Application No. 2011-100980 (Patent Document 3) that hydrogen existing in an insulating film with a defect is more stable than hydrogen existing in an oxide semiconductor.

In one embodiment of the present invention, the following is to be used to generate a defect in an insulating film in contact with an oxide semiconductor: addition of an impurity such as argon, nitrogen, carbon, phosphorus, boron, or metal; plasma treatment; UV irradiation; or the like. A region in which a defect is to be generated preferably includes a region overlapping with at least a source region and a drain region of an oxide semiconductor and preferably does not include a region overlapping with a channel formation region.

Hydrogen in the oxide semiconductor is attracted to the defect generated in the insulating film. Due to the presence of hydrogen, the defect is stabilized (hydrogen is trapped).

Therefore, in a semiconductor device according to one embodiment of the present invention, a region of an insulating film which overlaps with at least a source region and a drain region contains a higher proportion of hydrogen than a region overlapping with a channel formation region. Further, the region of the insulating film which overlaps with at least the source region and the drain region contains a higher proportion of impurities such as argon, nitrogen, phosphorus, or boron than the region overlapping with the channel formation region.

One embodiment of the present invention is a semiconductor device including an insulating film, an oxide semiconductor film in contact with the insulating film and including a channel formation region provided between a source region and a drain region, and a gate electrode overlapping with the oxide semiconductor film with a gate insulating film provided therebetween. In the semiconductor device, in at least one of the insulating film and the gate insulating film, a region overlapping with at least the source region and the drain region contains a higher proportion of hydrogen than a region overlapping with the channel formation region.

In at least one of the insulating film and the gate insulating film, the region overlapping with at least the source region and the drain region may contain a higher proportion of impurity than the region overlapping with the channel formation region.

The impurity can be at least one kind selected from nitrogen (N), argon (Ar), carbon (C), phosphorus (P), and boron (B).

In at least one of the insulating film and the gate insulating film, an impurity concentration in the region overlapping with at least the source region and the drain region can be higher than or equal to $10^{14}$ atoms/cm$^3$ and lower than or equal to $10^{22}$ atoms/cm$^3$.

The source region and the drain region may contain the impurity.

A hydrogen concentration in the channel formation region of the oxide semiconductor film can be lower than or equal to $5 \times 10^{18}$ atoms/cm$^3$.

The source region and the drain region can contain the impurity.

The crystallinity of the source region and the drain region of the oxide semiconductor film may be lower than the crystallinity of the channel formation region.

In accordance with one embodiment of the present invention, a transistor with stable threshold voltage, which includes an oxide semiconductor, can be provided. Further, a semiconductor device with improved reliability, which has a transistor including an oxide semiconductor, can be provided.

BRIEF DESCRIPTION OF THE DRAWINGS

FIGS. 9A1, 9A2, 9B, 9C1, 9C2, and 9D illustrate a semiconductor device according to one embodiment of the present invention.

DETAILED DESCRIPTION OF THE INVENTION

Embodiments of the invention disclosed in this specification will be described below with reference to the accompanying drawings. Note that the invention disclosed in this specification is not limited to the following description, and it is easily understood by those skilled in the art that modes and details can be variously changed. Therefore, the invention disclosed in this specification is not construed as being limited to the description of the following embodiments.

Note that a transistor whose source electrode and drain electrode are not illustrated in a drawing may be referred to as a transistor for the sake of convenience. Further, in such a case, in description of a connection of a transistor, a source region and a source electrode are collectively referred to as a "source electrode," and a drain region and a drain electrode are collectively referred to as a "drain electrode". That is, in this specification, the term "source electrode" may include a source region.

Functions of a "source" (or "source region") and a "drain" (or "drain region") are sometimes replaced with each other when a transistor of opposite polarity is used or when the direction of current flowing is changed in circuit operation, for example. Thus, the terms "source" and "drain" can be replaced with each other in this specification and the like. Further, in this specification and the like, a channel formation region is a region between a source region (or a source electrode) and a drain region (or a drain electrode).

Embodiment 1

In this embodiment, a structure and a manufacturing method of a semiconductor device according to one embodiment of the present invention is described with reference to FIGS. 1A and 1B and FIGS. 2A to 2D.

<<Structure>>

Figure 1A:
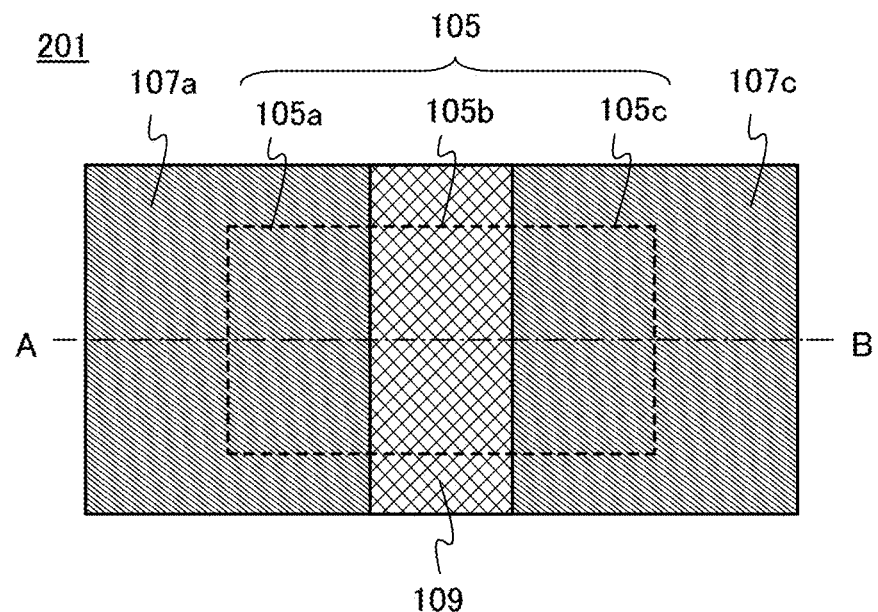
FIGS. 1A and 1B illustrate a semiconductor device according to one embodiment of the present invention.
Figure 1B:
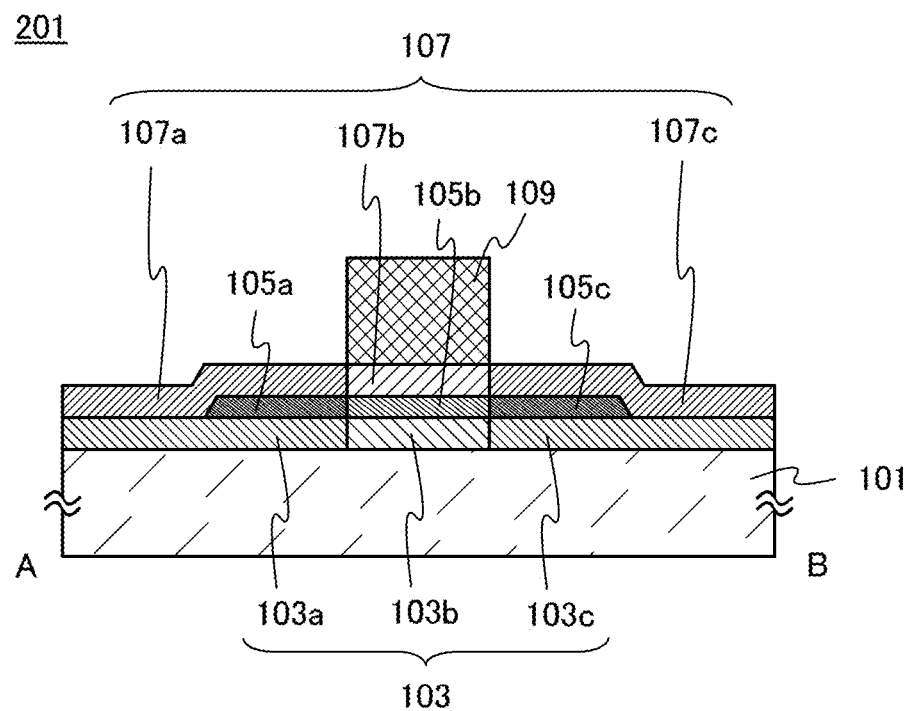

First, a structure of a semiconductor device is described. FIGS. 1A and 1B show a transistor 201 as an example of a semiconductor device. FIG. 1A is a top view of the transistor 201. FIG. 1B is a cross-sectional view along the line A-B in FIG. 1A.

The transistor 201 includes, over a substrate 101, an insulating film 103, an oxide semiconductor film 105 which is in contact with the insulating film 103, and a gate electrode 109 overlapping with the oxide semiconductor film 105 with the gate insulating film 107 provided therebetween. The oxide semiconductor film 105 includes a source region 105a, a drain region 105c, and a channel formation region 105b sandwiched between the source region 105a and the drain region 105c. The insulating film 103 includes a region 103b overlapping with the channel formation region, a region 103a overlapping with at least the source region, and a region 103c overlapping with at least the drain region. The gate insulating film 107 includes a region 107b overlapping with the channel formation region, a region 107a overlapping with at least the source region, and a region 107c overlapping with at least the drain region.

Here, in at least one of the insulating film 103 and the gate insulating film 107, regions overlapping with at least the source region and the drain region are formed using an insulating film including a higher proportion of hydrogen than a region overlapping with the channel formation region.

In the insulating film, hydrogen is trapped by being attracted from the oxide semiconductor film 105.

Further, in the case where impurities are added in order to attract and trap hydrogen, the insulating film may become an insulating film including impurities in addition to hydrogen.

This can also be described as follows. In the insulating film 103, the region 103a overlapping with at least the source region and the region 103c overlapping with at least the drain region include a higher proportion of hydrogen than the region 103b overlapping with the channel formation region. In the insulating film 103, the region 103a overlapping with at least the source region and the region 103c overlapping with at least the drain region may include a higher proportion of impurities than the region 103b overlapping with the channel formation region.

Further, in the gate insulating film 107, the region 107a overlapping with at least the source region and the region 107c overlapping with at least the drain region include a higher proportion of hydrogen than the region 107b overlapping with the channel formation region. Further, in the gate insulating film 107, the region 107a overlapping with at least the source region and the region 107c overlapping with at least the drain region may include a higher proportion of impurities than the region 107b overlapping with the channel formation region.

With a structure where the region 103b overlapping with the channel formation region or the region 107b overlapping with the channel formation region includes a low proportion of impurities and hydrogen, it is possible to prevent hydrogen from adversely affecting the characteristics of the transistor.

In the oxide semiconductor film 105, the source region 105a and the drain region 105c may include impurities and hydrogen at a proportion higher than that in the channel formation region 105b.

With a structure where the source region 105a and the drain region 105c include a high proportion of impurities, hydrogen in the channel formation region 105b can be attracted and trapped. When the source region 105a and the drain region 105c include a high proportion of impurities and hydrogen, the resistances of the source region 105a and the drain region 105c are reduced. Thus, electrical connection between each of the source and the drain regions 105a and 105c and a wiring is improved. Further, the source region 105a and the drain region 105c can serve as lightly doped drain (LDD) regions to suppress the degradation of transistor characteristics.

Note that the hydrogen concentration in the channel formation region 105b of the oxide semiconductor film 105 is lower than or equal to $5\times10^{19}$ atoms/cm$^3$, preferably, lower than or equal to $5\times10^{18}$ atoms/cm$^3$, more preferably, lower than or equal to $5\times10^{17}$ atoms/cm$^3$.

The reduction of hydrogen concentration in the channel formation region 105b leads to the reduction of carrier density, thereby inhibiting a shift of the threshold voltage of the transistor in the negative direction. Further, the off-state current of the transistor can be markedly reduced. The off-state current of the transistor including an oxide semiconductor can be as low as 10 yA/μm ($1\times10^{-23}$ A/μm) or less at room temperature, and 1 zA/μm ($1\times10^{-21}$ A/μm) or less at 85° C. to 95° C. The off-state current can be measured by a method disclosed in Japanese Published Patent Application No. 2011-237418 (Patent Document 4), for example.

The crystallinity of the source region 105a and the drain region 105c may be lower than the crystallinity of the channel formation region 105b.

An oxide semiconductor may include a non-single-crystal, for example. The non-single-crystal is, for example, structured by at least one of c-axis aligned crystal (CAAC), polycrystal, microcrystal, and an amorphous part.

An oxide semiconductor may include CAAC, for example. Note that an oxide semiconductor including CAAC is referred to as a CAAC-OS (c-axis aligned crystalline oxide semiconductor).

In an image obtained with a transmission electron microscope (TEM), for example, crystal parts can be found in the CAAC-OS in some cases. In most cases, in an image obtained with a TEM, crystal parts in the CAAC-OS each fit inside a cube whose one side is less than 100 nm, for example. In an image obtained with a TEM, a boundary between the crystal parts in the CAAC-OS is not clearly observed in some cases. Further, in an image obtained with a TEM, a grain boundary in the CAAC-OS is not clearly observed in some cases. In the CAAC-OS, since a clear grain boundary does not exist, for example, segregation of an impurity is unlikely to occur. In the CAAC-OS, since a clear boundary does not exist, for example, high density of defect states is unlikely to occur. In the CAAC-OS, since a clear grain boundary does not exist, for example, a reduction in electron mobility is unlikely to occur.

For example, the CAAC-OS includes a plurality of crystal parts. In the plurality of crystal parts, c-axes are aligned in a direction parallel to a normal vector of a surface where the CAAC-OS is formed or a normal vector of a surface of the CAAC-OS in some cases. When the CAAC-OS is analyzed by an out-of-plane method with an X-ray diffraction (XRD) apparatus, a peak at 2θ of around 31 degrees which shows alignment appears in some cases. Further, for example, spots (luminescent spots) are observed in an electron diffraction image of the CAAC-OS in some cases. An electron diffraction image obtained with an electron beam having a beam diameter of 10 nmϕ or smaller, or 5 nmϕ or smaller, is called a nanobeam electron diffraction image. In the CAAC-OS, for example, among crystal parts, the directions of the a-axis and the b-axis of one crystal part are different from those of another crystal part, in some cases. In the CAAC-OS, for example, c-axes are aligned, and a-axes and/or b-axes are not macroscopically aligned, in some cases.

In each of the crystal parts included in the CAAC-OS, for example, a c-axis is aligned in a direction parallel to a normal vector of a surface where the CAAC-OS is formed or a normal vector of a surface of the CAAC-OS, triangular or hexagonal atomic arrangement that is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a term "perpendicular" includes a range from 80° to 100°, preferably from 85° to 95°. In addition, a term "parallel" includes a range from −10° to 10°, preferably from −5° to 5°.

Further, the CAAC-OS can be formed by reducing the density of defect states for example. In an oxide semiconductor, for example, oxygen vacancies are defect states. The oxygen vacancies serve as trap levels or serve as carrier generation sources when hydrogen is trapped therein. In order to form the CAAC-OS, for example, it is important to prevent oxygen vacancies from being generated in the oxide semiconductor. Thus, the CAAC-OS is an oxide semiconductor having a low density of defect states. In other words, the CAAC-OS is an oxide semiconductor having few oxygen vacancies.

The state in which impurity concentration is low and density of defect states is low (the number of oxygen vacancies is small) is referred to as "highly purified intrinsic" or "substantially highly purified intrinsic". A highly purified intrinsic or substantially highly purified intrinsic oxide semiconductor has few carrier generation sources, and thus has a low carrier density in some cases. Thus, in some cases, a transistor including the oxide semiconductor in a channel formation region rarely has a negative threshold voltage (is rarely normally-on). A highly purified intrinsic or substantially highly purified intrinsic oxide semiconductor has a low density of defect states and accordingly has low density of trap states in some cases. Thus, the transistor including the oxide semiconductor in the channel formation region has a small variation in electrical characteristics and high reliability in some cases. A charge trapped by the trap states in the oxide semiconductor takes a long time to disappear. The trapped charge may behave like a fixed charge. Thus, the transistor which includes the oxide semiconductor having a high density of trap states in the channel formation region has unstable electrical characteristics in some cases.

With the use of the highly purified intrinsic or substantially highly purified intrinsic CAAC-OS in a transistor, variation in the electrical characteristics of the transistor due to irradiation with visible light or ultraviolet light is small.

An oxide semiconductor may include polycrystal, for example. Note that an oxide semiconductor including polycrystal is referred to as a polycrystalline oxide semiconductor. A polycrystalline oxide semiconductor includes a plurality of crystal grains.

An oxide semiconductor may include microcrystal, for example. Note that an oxide semiconductor including microcrystal is referred to as a microcrystalline oxide semiconductor.

In an image obtained with a TEM, for example, crystal parts cannot be found clearly in the microcrystalline oxide semiconductor in some cases. In most cases, the size of a crystal part included in the microcrystalline oxide semiconductor is greater than or equal to 1 nm and less than or equal to 100 nm, or greater than or equal to 1 nm and less than or equal to 10 nm, for example. A microcrystal with a size greater than or equal to 1 nm and less than or equal to 10 nm is specifically referred to as nanocrystal (nc), for example. An oxide semiconductor including nanocrystal is referred to as a nanocrystalline oxide semiconductor (nc-OS). In an image of the nc-OS obtained with a TEM, for example, a boundary between crystal parts is not clearly detected in some cases. In an image of the nc-OS obtained with a TEM, for example, since a clear grain boundary does not exist, for example, segregation of an impurity is unlikely to occur. In the nc-OS, since a clear grain boundary does not exist, for example, high density of defect states is unlikely to occur. In the nc-OS, since a clear grain boundary does not exist, for example, a reduction in electron mobility is unlikely to occur.

In the nc-OS, for example, a microscopic region (for example, a region with a size greater than or equal to 1 nm and less than or equal to 10 nm) has a periodic atomic order occasionally. Further, for example, in the nc-OS, crystal parts are not regularly-arranged. Thus, there is a case where periodic atomic order is not observed microscopically or a case where long-range order in atomic arrangement is not observed. Accordingly, in some cases, the nc-OS cannot be distinguished from an amorphous oxide semiconductor, for example, depending on an analysis method. When the nc-OS is analyzed by an out-of-plane method with an XRD apparatus using an X-ray having a beam diameter larger than that of a crystal part, a peak which shows alignment does not appear in some cases. Further, for example, a halo pattern is shown in some cases in an electron diffraction image of the nc-OS obtained by using an electron beam having a beam diameter larger than that of a crystal part (for example, a beam diameter of 20 nm$\phi$ or more, or 50 nm$\phi$ or more). For example, spots are shown in some cases in a nanobeam electron diffraction image of the nc-OS obtained by using an electron beam having a beam diameter smaller than or equal to that of a crystal part (for example, a beam diameter of 10 mm$\phi$ or less, or 5 mm$\phi$ or less). In a nanobeam electron diffraction image of the nc-OS, for example, regions with high luminance in a circular pattern are shown in some cases. In a nanobeam electron diffraction image of the nc-OS, for example, a plurality of spots is shown in the region in some cases.

Since the microscopic region in the nc-OS has a periodic atomic order occasionally, the nc-OS has lower density of defect states than the amorphous oxide semiconductor. Note that since crystal parts in the nc-OS are not regularly-arranged, the nc-OS has higher density of defect states than the CAAC-OS.

Note that the oxide semiconductor may be a mixed film including two or more of a CAAC-OS, a polycrystalline oxide semiconductor, a microcrystalline oxide semiconductor, and an amorphous oxide semiconductor. The mixed film includes two or more of an amorphous oxide semiconductor region, a microcrystalline oxide semiconductor region, a polycrystalline oxide semiconductor region, and a CAAC-OS region in some cases. The mixed film has a stacked-layer structure of two or more of an amorphous oxide semiconductor region, a microcrystalline oxide semiconductor region, a polycrystalline oxide semiconductor region, and a CAAC-OS region in some cases.

<<Material and Manufacturing Method>>

Next, a material and a manufacturing method which can be used for the semiconductor device are described. FIGS. 2A to 2D show a part of a process for manufacturing the transistor 201 which is an example of the semiconductor device.

<Substrate>

There is no particular limitation on a substrate that can be used as the substrate 101 having an insulating surface as long as it has at least heat resistance enough to withstand heat treatment in a later step. For example, a glass substrate of barium borosilicate glass, aluminoborosilicate glass, or the like, a ceramic substrate, a quartz substrate, or a sapphire substrate can be used. A single crystal semiconductor substrate or a polycrystalline semiconductor substrate formed of silicon, silicon carbide, or the like; a compound semiconductor substrate of silicon germanium or the like; an SOI substrate; or the like can be used as the substrate 101, or the substrate provided with a semiconductor element can be used as the substrate 101.

The semiconductor device may be manufactured using a flexible substrate as the substrate 101. To manufacture a flexible semiconductor device, the transistor 201 including the oxide semiconductor film 105 may be directly formed over a flexible substrate; or alternatively, the transistor 201 including the oxide semiconductor film 105 may be formed over a substrate, and then may be separated and transferred to a flexible substrate. Note that in order to separate the transistor 201 from the manufacturing substrate and transfer it to the flexible substrate, a separation layer is preferably provided between the manufacturing substrate and the transistor 201 including the oxide semiconductor film. As the separation layer, for example, metal such as tungsten can be used.

Preferably, the insulating film 103 is provided as a base insulating film over the substrate 101 and a semiconductor device is manufactured over the insulating film 103. The insulating film 103 can be formed by a plasma CVD method, a sputtering method, or the like. The insulating film 103 can have a single-layer structure or a stacked-layer structure of one or more film containing a silicon oxide, silicon nitride, silicon oxynitride, silicon nitride oxide, aluminum oxide, aluminum nitride, aluminum oxynitride, aluminum nitride oxide, hafnium oxide, gallium oxide, or a mixed material including any of these materials. In the case of using a plasma CVD method, a hydrogen compound of metal, a hydrogen compound of silicon, a metal compound, a halide, or the like can be used as a source gas. For example, when silicon oxynitride is formed, silane and nitrous oxide can be used as a source gas. When gallium oxide is formed, trimethylgallium or the like can be used. Further, a silicon substrate may be used as the substrate 101 and a silicon oxide film formed by oxidizing the silicon substrate can be used as the insulating film 103.

Note that the insulating film 103 is preferably formed with a single-layer structure or a stacked-layer structure including an insulating oxide layer.

It is preferable that the insulating film 103 include an oxygen-excess region. This is because oxygen vacancies in the oxide semiconductor film 105, which is formed in a later step, can be filled with excess oxygen contained in the insulating film 103. In the case where the insulating film 103 has a stacked-layer structure, the insulating film 103 preferably includes an oxygen-excess region at least in a layer in contact with the oxide semiconductor film 105. In order to provide the oxygen-excess region in the insulating film 103, for example, the insulating film 103 may be formed in an oxygen atmosphere. Alternatively, the oxygen-excess region may be formed by introducing oxygen (including at least one of an oxygen radical, an oxygen atom, and an oxygen ion) to the insulating film 103 after the formation of the insulating film 103. Oxygen can be introduced by an ion implantation method, an ion doping method, a plasma immersion ion implantation method, plasma treatment, or the like.

The insulating film 103 preferably includes a silicon nitride film, a silicon nitride oxide film, or an aluminum oxide film being in contact with the bottom surface of a layer having the oxygen-excess region. When the insulating film 103 includes a silicon nitride film, a silicon nitride oxide film, or an aluminum oxide film, diffusion of impurities to the oxide semiconductor film 105 can be prevented.

<Oxide Semiconductor Film>

Figure 2A:
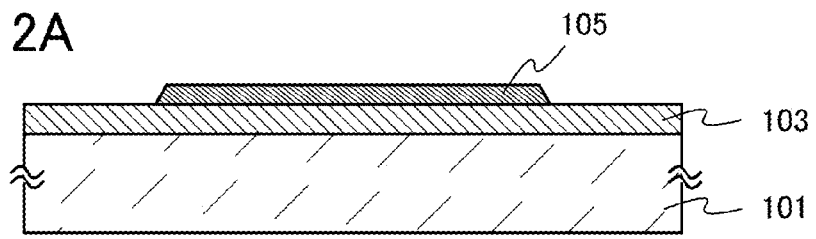
FIGS. 2A to 2D illustrate a method for manufacturing a semiconductor device according to one embodiment of the present invention.

Next, an oxide semiconductor film is formed over the substrate 101 and is processed into an island shape to form the oxide semiconductor film 105 (see FIG. 2A). The thickness of the oxide semiconductor film 105 is, for example, 1 nm to 30 nm, preferably 5 nm to 10 nm.

The oxide semiconductor film may have either a single-layer structure or a stacked-layer structure. Further, the oxide semiconductor film may have either an amorphous structure or a crystalline structure. In the case where the oxide semiconductor film has an amorphous structure, the oxide semiconductor film may be subjected to heat treatment in a later manufacturing step to have crystallinity. The heat treatment for crystallizing the amorphous oxide semiconductor film is performed at a temperature higher than or equal to 250° C. and lower than or equal to 700° C., preferably higher than or equal to 400° C., more preferably higher than or equal to 500° C., still more preferably higher than or equal to 550° C. Note that the heat treatment can also serve as another heat treatment in the manufacturing process.

The oxide semiconductor film can be formed by a sputtering method, a molecular beam epitaxy (MBE) method, a plasma CVD method, a pulse laser deposition method, an atomic layer deposition (ALD) method, a mist CVD method, or the like as appropriate.

In the formation of the oxide semiconductor film, the hydrogen concentration in the oxide semiconductor film is preferably reduced as much as possible. In order to reduce the hydrogen concentration, for example, in the case where a sputtering method is used for film formation, a high-purity rare gas (typically, argon) from which impurities such as hydrogen, water, a hydroxyl group, and a hydride have been removed; oxygen; or a mixed gas of oxygen and the rare gas is preferably used as appropriate as an atmosphere gas supplied to a treatment chamber of a sputtering apparatus.

The oxide semiconductor film is formed in such a manner that a sputtering gas from which hydrogen and moisture have been removed is introduced into a deposition chamber while moisture remaining therein is removed, whereby the hydrogen concentration in the formed oxide semiconductor film can be reduced. In order to remove the residual moisture in the deposition chamber, an entrapment vacuum pump, for example, a cryopump, an ion pump, or a titanium sublimation pump is preferably used. Alternatively, a turbo molecular pump provided with a cold trap may also be used. When the deposition chamber is evacuated with the cryopump, which has a high capability in removing a hydrogen molecule, a compound containing a hydrogen atom such as water, and also a compound containing a carbon atom, and the like; thus, the impurity concentration in the oxide semiconductor film formed in the deposition chamber can be reduced.

Further, in the case where the oxide semiconductor film is formed by a sputtering method, the relative density (the fill rate) of a metal oxide target which is used for forming the oxide semiconductor film is greater than or equal to 90% and less than or equal to 100%, preferably greater than or equal to 95% and less than or equal to 99.9%. This is because, with the use of the metal oxide target with a high relative density, the formed oxide semiconductor film can be a dense film.

To reduce the impurity concentration in the oxide semiconductor film, it is also effective to form the oxide semiconductor film while the substrate 101 is kept at high temperature. The heating temperature of the substrate 101 may be higher than or equal to 150° C. and lower than or equal to 450° C., and preferably, the substrate temperature is higher than or equal to 200° C. and lower than or equal to 350° C. By heating the substrate at high temperature during the film formation, the crystallinity of the oxide semiconductor film can be increased.

An oxide semiconductor used for the oxide semiconductor film 105 preferably contains at least indium (In). In particular, indium and zinc (Zn) are preferably contained. In addition, as a stabilizer for reducing the variation in electrical characteristics of a transistor using the oxide semiconductor, the oxide semiconductor preferably gallium (Ga) in addition to In and Zn. It is preferable that one or more elements selected from tin (Sn), hafnium (Hf), aluminum (Al), and zirconium (Zr) be contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, any of the following can be used: indium oxide; tin oxide; zinc oxide; a two-component metal oxide such as an In—Zn-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, an In—Hf—Zn-based oxide, an In—La—Zn-based oxide, an In—Ce—Zn—based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that here, for example, an In—Ga—Zn-based oxide means an oxide containing In, Ga, and Zn as its main component, and there is no particular limitation on the ratio of In, Ga, and Zn. The In—Ga—Zn-based oxide may contain a metal element other than In, Ga, and Zn.

Alternatively, a material represented by $InMO_3(ZnO)_m$ (m>0 is satisfied, and m is not an integer) may be used as an oxide semiconductor. Note that M represents one or more metal elements selected from Ga, Fe, Mn, and Co. Alternatively, as the oxide semiconductor, a material expressed by a chemical formula, $In_2SnO_5(ZnO)_n$ (n>0, n is an integer) may be used.

For example, it is possible to use an In—Ga—Zn-based oxide with an atomic ratio of In:Ga:Zn=1:1:1, In:Ga:Zn=2:2:1, or In:Ga:Zn=3:1:2, or any of oxides whose composition is in the neighborhood of the above compositions. Alternatively, it is possible to use an In—Sn—Zn-based oxide with an atomic ratio of In:Sn:Zn=1:1:1, In:Sn:Zn=2:1:3, or In:Sn:Zn=2:1:5, or any of oxides whose composition is in the neighborhood of the above compositions.

Note that for example, the expression "the composition of an oxide including In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

However, the present invention is not limited to the above compositions, and an oxide having an appropriate composition may be used depending on needed electrical characteristics of a transistor (e.g., field-effect mobility, threshold voltage, or variation). In order to obtain the needed electrical characteristics, the carrier concentration, the impurity concentration, the defect density, the atomic ratio between a metal element and oxygen, the interatomic distance, the density, and the like are preferably set to appropriate values.

For example, high field-effect mobility can be obtained relatively easily in a transistor including an In—Sn—Zn-based oxide semiconductor. Also in the case of a transistor including an In—Ga—Zn-based oxide semiconductor, the field-effect mobility can be increased by reducing the defect density in a bulk.

The oxide semiconductor film 105 may have a single-layer structure or a stacked-layer structure of a plurality of oxide semiconductor films. For example, the oxide semiconductor film 105 may have a stacked-layer structure of a first oxide semiconductor film and a second oxide semiconductor film that are formed using metal oxides with different compositions. For example, the first oxide semiconductor film may be formed using a three-component metal oxide, and the second oxide semiconductor film may be formed using a two-component metal oxide. Alternatively, for example, both the first oxide semiconductor film and the second oxide semiconductor film may be formed using a three-component metal oxide.

Further, the constituent elements of the first oxide semiconductor film and the second oxide semiconductor film are made to be the same and the composition of the constituent elements of the first oxide semiconductor film and the second oxide semiconductor film may be made to be different. For example, the first oxide semiconductor film may have an atomic ratio of In:Ga:Zn=1:1:1 or an atomic ratio in the neighborhood of the atomic ratio, and the second oxide semiconductor film may have an atomic ratio of In:Ga:Zn=3:1:2 or an atomic ratio in the neighborhood of the atomic ratio. Alternatively, the first oxide semiconductor film may have an atomic ratio of In:Ga:Zn=1:3:2 or an atomic ratio in the neighborhood of the atomic ratio, and the second oxide semiconductor film may have an atomic ratio of In:Ga:Zn=2:1:3 or an atomic ratio in the neighborhood of the atomic ratio.

At this time, in one of the first oxide semiconductor film and the second oxide semiconductor film which is closer to the gate electrode (on a channel side), the percentage of the In content is preferably higher than the percentage of the Ga content. In the other film which is farther from the gate electrode (on a back channel side), the percentage of the In content is preferably lower than or equal to the percentage of the Ga content.

In an oxide semiconductor, the s orbit of heavy metal mainly contributes to carrier transfer, and when the percentage of the In content in the oxide semiconductor is increased, overlap of the s orbits is likely to be increased. Therefore, an oxide having a composition of In>Ga has higher mobility than an oxide having a composition of In≤Ga. Further, in Ga, the formation energy of oxygen vacancy is larger and thus oxygen vacancy is less likely to occur, than in In; therefore, the oxide having a composition of In≤Ga has more stable characteristics than the oxide having a composition of In>Ga.

An oxide semiconductor having a composition of In>Ga is used on the channel side, and an oxide semiconductor having a composition of In≤Ga is used on the back channel side, so that mobility and reliability of the transistor can be further improved.

Further, oxide semiconductor films having different crystallinities may be used for the first oxide semiconductor film and the second oxide semiconductor film. That is, the oxide semiconductor films may be formed using any of a single crystal oxide semiconductor film, a polycrystalline oxide semiconductor film, an amorphous oxide semiconductor film, and a CAAC-OS film, as appropriate. When an amorphous oxide semiconductor film is used for at least one of the first oxide semiconductor film and the second oxide semiconductor film, internal stress or external stress of the oxide semiconductor film 105 is relieved, variations in characteristics of the transistor are reduced, and the reliability of the transistors can be further increased.

On the other hand, an amorphous oxide semiconductor film is likely to absorb an impurity which serves as a donor, such as hydrogen, and is likely to generate oxygen vacancy, and thus easily becomes n-type. For this reason, an oxide semiconductor film having crystallinity such as a CAAC-OS film is preferably used for the oxide semiconductor film on the channel side.

Further, the oxide semiconductor film 105 is preferably subjected to heat treatment for removing excess hydrogen, including water and a hydroxyl group, (dehydration or dehydrogenation) contained in the oxide semiconductor film 105. The temperature of the heat treatment is higher than or equal to 300° C. and lower than or equal to 700° C., or lower than the strain point of the substrate. The heat treatment can be performed under reduced pressure, a nitrogen atmosphere, or the like.

By the heat treatment, the hydrogen concentration in the oxide semiconductor film 105 after the dehydration or dehydrogenation treatment can be lower than or equal to $5\times10^{19}/cm^3$, preferably lower than or equal to $5\times10^{18}/cm^3$, more preferably lower than or equal to $5\times10^{17}$ atoms/$cm^3$.

Note that the heat treatment for the dehydration or dehydrogenation may be performed at any timing in the manufacturing process of the transistor 201 as long as the heat treatment is performed after the formation of the oxide semiconductor film. The heat treatment for dehydration or dehydrogenation may be performed a plurality of times, and may also serve as another heat treatment.

Note that in the case where an insulating film containing oxygen is provided as the base insulating film, the heat treatment for the dehydration or dehydrogenation is preferably performed before the oxide semiconductor film is processed into an island shape because oxygen contained in the base insulating film can be prevented from being released to the outside by the heat treatment.

In the heat treatment, it is preferable that water, hydrogen, or the like be not contained in nitrogen or a rare gas such as helium, neon, or argon. The purity of nitrogen or the rare gas such as helium, neon, or argon which is introduced into the heat treatment apparatus is set to preferably 6N (99.9999%) or higher, further preferably 7N (99.99999%) or higher (that is, the impurity concentration is preferably 1 ppm or lower, further preferably 0.1 ppm or lower).

In addition, after the oxide semiconductor film 105 is heated by the heat treatment, a high-purity oxygen gas, a high-purity nitrous oxide gas, or ultra dry air (the moisture amount is less than or equal to 20 ppm (−55° C. by conversion into a dew point), preferably less than or equal to 1 ppm, further preferably less than or equal to 10 ppb, in the measurement with use of a dew point meter of a cavity ring down laser spectroscopy (CRDS) system) may be introduced into the same furnace while the heating temperature is being maintained or being gradually decreased. It is preferable that water, hydrogen, or the like be not contained in the oxygen gas or the nitrous oxide gas. The purity of the oxygen gas or the nitrous oxide gas which is introduced into the heat treatment apparatus is preferably higher than or equal to 6N, further preferably higher than or equal to 7N (i.e., the impurity concentration in the oxygen gas or the nitrous oxide gas is preferably lower than or equal to 1 ppm, further preferably lower than or equal to 0.1 ppm). The oxygen gas or the nitrous oxide gas acts to supply oxygen, which is a main component of the oxide semiconductor and has been reduced by the step of removing impurities for dehydration or dehydrogenation. By supplying oxygen, the oxide semiconductor film 105 can have high purity and be an i-type (intrinsic) oxide semiconductor film. Variation in electrical characteristics of a transistor having an i-type (intrinsic) oxide semiconductor is suppressed, and the transistor is electrically stable.

Further or alternatively, oxygen (which includes at least one of an oxygen radical, an oxygen atom, and an oxygen ion) may be added to the oxide semiconductor film after being subjected to the dehydration or dehydrogenation treatment to supply oxygen to the oxide semiconductor film.

Oxygen may be directly introduced into the oxide semiconductor film or may be introduced into the oxide semiconductor film 105 through another film such as the gate insulating film 107 to be formed later. When oxygen is introduced through another film, an ion implantation method, an ion doping method, a plasma immersion ion implantation method, or the like may be used. In the case where oxygen is directly introduced into the oxide semiconductor film 105 which is exposed, plasma treatment or the like can be used in addition to the above-described methods.

As a gas for supplying oxygen, a gas containing O may be used; for example, an $O_2$ gas, an $N_2O$ gas, a $CO_2$ gas, a CO gas, or an $NO_2$ gas may be used. Note that a rare gas (e.g., an Ar gas) may be contained in the supply gas of the oxygen.

For example, in the case where an oxygen ion is introduced into the oxide semiconductor film 105 by an ion implantation method, the dosage can be greater than or equal to $1\times10^{13}$ ions/$cm^2$ and less than or equal to $5\times10^{16}$ ions/$cm^2$.

Alternatively, oxygen may be supplied to the oxide semiconductor film 105 in the following manner: an insulating layer in contact with the oxide semiconductor film 105 is formed to have an oxygen-excess region; and heat treatment is performed in a state where the insulating layer and the oxide semiconductor film 105 are in contact with each other, so that excess oxygen contained in the insulating layer is diffused to the oxide semiconductor film 105. The heat treatment may serve as another heat treatment in the manufacturing process of the transistor 201.

The timing of supply of oxygen to the oxide semiconductor film is not particularly limited to the above as long as it is after the formation of the oxide semiconductor film. Oxygen may be introduced into the oxide semiconductor film plural times. Further, in the case where the oxide semiconductor film has a stacked-layer structure of a plurality of layers, heat treatment for dehydration or dehydrogenation and/or oxygen supply may be performed separately on each oxide semiconductor film or may be performed once on the oxide semiconductor film after the oxide semiconductor film having a stacked-layer structure is formed.

In the case of forming the insulating film 103, the insulating film 103 and the oxide semiconductor film 105 are preferably formed in succession without exposure to the air. According to successive formation of the insulating film 103 and the oxide semiconductor film 105 without exposure to the air, impurities such as hydrogen and moisture can be prevented from being adsorbed onto a top surface of the insulating film 103.

<Gate Insulating Film>

Next, the gate insulating film 107 covering the oxide semiconductor film 105 is formed. In this embodiment, the gate insulating film 107 can be formed with a thickness greater than or equal to 1 nm and less than or equal to 20 nm by a sputtering method, an MBE method, a CVD method, a pulsed laser deposition method, an ALD method, or the like as appropriate. Note that a high-density plasma CVD method using microwaves (e.g., with a frequency of 2.45 GHz) is preferably employed for forming the gate insulating film 107 because an insulating layer can be dense and can have high breakdown voltage and high quality.

The gate insulating film 107 can be formed using a silicon oxide film, a gallium oxide film, an aluminum oxide film, a silicon nitride film, a silicon oxynitride film, an aluminum oxynitride film, or a silicon nitride oxide film. A portion of the gate insulating film 107, which is in contact with the oxide semiconductor film 105, preferably contains oxygen. In particular, the gate insulating film 107 preferably contains, in the film (bulk), oxygen in excess of the stoichiometric composition. For example, in the case where a silicon oxide film is used as the gate insulating film 107, the composition formula is preferably $SiO_{2+\alpha}$ ($\alpha>0$). Further, the gate insulating film 107 is preferably formed in consideration of the size of a transistor to be formed and the step coverage with the gate insulating film 107.

Further, as a material for the gate insulating film 107, hafnium oxide, yttrium oxide, hafnium silicate ($HfSi_xO_y$, ($x>0$, $y>0$)), hafnium silicate to which nitrogen is added, hafnium aluminate ($HfAl_xO_y$, ($x>0$, $y>0$)), lanthanum oxide, or the like may be used. Furthermore, the gate insulating film 107 may have either a single-layer structure or a stacked-layer structure.

<Gate Electrode>

Figure 2B:
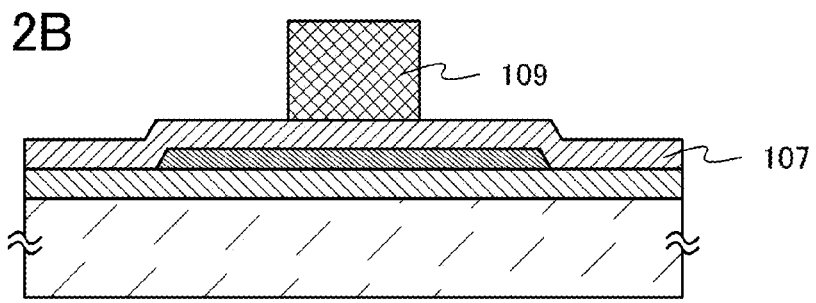

Next, a conductive film is formed over the gate insulating film 107, and the conductive film is etched, whereby the gate electrode 109 is formed (see FIG. 2B).

The gate electrode 109 can be formed using a metal such as molybdenum, titanium, tantalum, tungsten, aluminum, copper, chromium, neodymium, or scandium, or an alloy which includes any of these materials as a main component. Alternatively, a semiconductor film typified by a polycrystalline silicon film doped with an impurity such as phosphorus, or a silicide film of nickel silicide or the like may be used as the gate electrode 109. The gate electrode 109 may have a single-layer structure or a stacked-layer structure. The thickness of the gate electrode 109 is preferably greater than or equal to 50 nm and less than or equal to 300 nm.

The gate electrode 109 can also be formed using a conductive material such as indium oxide-tin oxide, indium oxide containing tungsten oxide, indium zinc oxide containing tungsten oxide, indium oxide containing titanium oxide, indium tin oxide containing titanium oxide, indium oxide-zinc oxide, or indium tin oxide to which silicon oxide is added. It is also possible that the gate electrode 109 has a stacked-layer structure of any of the above conductive materials and any of the above metal materials.

As one layer in a stacked-layer structure of the gate electrode 109, which is in contact with the gate insulating film 107, a metal oxide containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film can be used. These films each have a work function higher than or equal to 5 eV (electron volts), preferably higher than or equal to 5.5 eV (electron volts); thus, when these films are used for the gate electrode, the threshold voltage of the transistor can be positive. Accordingly, a so-called normally-off switching element can be achieved.

<Formation of Defect>

Next, a defect is generated in at least one of the insulating film 103 and the gate insulating film 107. The defect can be generated by adding an impurity such as argon, nitrogen, carbon, phosphorus, boron, or metal, performing plasma treatment, performing UV irradiation, or the like.

Hydrogen in the oxide semiconductor is attracted to the defect generated in the insulating film. Due to the presence of hydrogen, the defect is stabilized (hydrogen is trapped).

Figure 2C:
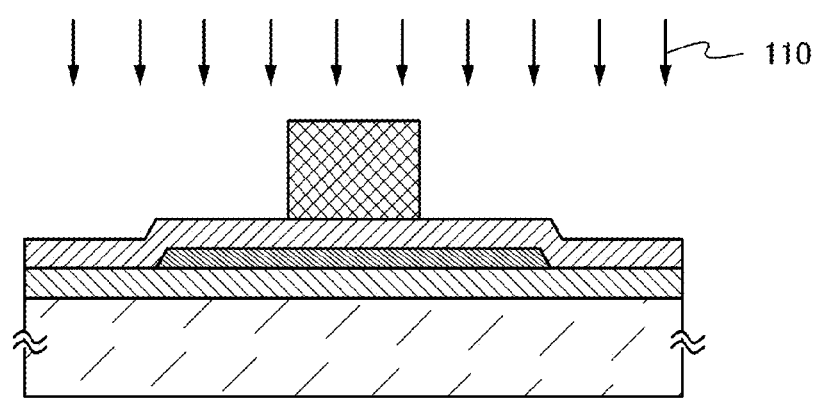

In this embodiment, an impurity 110 is added to the insulating film 103, the oxide semiconductor film 105, and the gate insulating film 107 in order to generate the defect (see FIG. 2C).

Figure 2D:
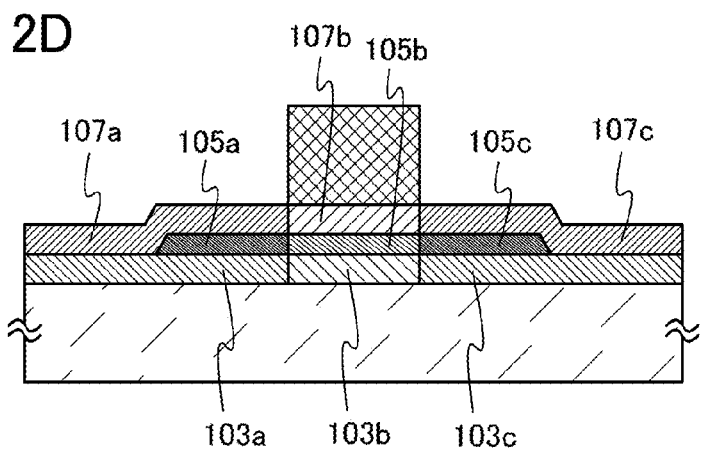

At this time, the gate electrode 109 is used as a mask, whereby the source region 105a, the drain region 105c, and the channel formation region 105b can be formed in a self-aligned manner in the oxide semiconductor film 105 (see FIG. 2D). Similarly, the region 103a overlapping with at least the source region, the region 103c overlapping with at least the drain region, and the region 103b overlapping with the channel formation region can be formed in a self-aligned manner in the insulating film 103. Similarly, the region 107a overlapping with at least the source region, the region 107c overlapping with at least the drain region, and the region 107b overlapping with the channel formation region can be formed in a self-aligned manner in the gate insulating film 107.

There is no particular limitation on the impurity 110. In general, nitrogen, a rare gas such as argon, carbon, phosphorus, boron, aluminum, arsenic, metal, or the like can be used. Further, In, Ga, Zn, Si, O, or the like which can be a constituent element of the oxide semiconductor film and the insulating film may be used. In that case, the compositions of the oxide semiconductor film 105, the insulating film 103, and the gate insulating film 107 may be changed.

As a method for adding the impurity 110, an ion doping method, an ion implantation method, or the like can be used.

By adding the impurity 110, defects such as dangling bonds are generated in the region 103a overlapping with at least the source region, the region 103c overlapping with at least the drain region, the region 107a overlapping with at least the source region, and the region 107c overlapping with at least the drain region.

In other words, the region 103a overlapping with at least the source region, the region 103c overlapping with at least the drain region, the region 107a overlapping with at least the source region, and the region 107c overlapping with at least the drain region are chemically activated.

Note that although FIG. 2C shows an example in which the impurity 110 is added to the insulating film 103, the oxide semiconductor film 105, and the gate insulating film 107, it is not necessary to add the impurity 110 to all of the three kinds of films. For example, the impurity 110 may be added only to the insulating film 103 or only to the gate insulating film 107.

Further, also in a film to which the impurity is not added, defects are generated in some cases by the passage of the impurity. For example, in the case where the impurity is added to the insulating film 103 by an ion doping method or the like but the impurity is not added to the gate insulating film 107, defects due to the passage of the impurity 110 might be generated in the gate insulating film 107.

Further, by adding the impurity 110, defects are generated in the source region 105a and the drain region 105c, leading to lowering of crystallinity. Therefore, for example, the channel formation region 105b can be a CAAC-OS film, and each of the source region 105a and the drain region 105c can be an amorphous oxide semiconductor film.

<Heat Treatment>

After adding the impurity 110, heat treatment is preferably performed. By performing the heat treatment, hydrogen is easily diffused from the oxide semiconductor film 105 to an insulating film in the vicinity of the oxide semiconductor film 105 (here, at least one of the insulating film 103 and the gate insulating film 107).

Hydrogen diffused from the oxide semiconductor film 105 is attracted to and trapped in the dangling bond included in the insulating film in the vicinity of the oxide semiconductor film 105. The dangling bond is stabilized by trapping hydrogen.

In other words, hydrogen is attracted to and trapped in the region 103a overlapping with at least the source region, the region 103c overlapping with at least the drain region, the region 107a overlapping with at least the source region, and the region 107c overlapping with at least the drain region which are chemically activated.

The heat treatment may be performed at a temperature which is sufficient to diffuse hydrogen. The diffusion coefficient of hydrogen in a CAAC-OS film is $3.0\times10^{-17}$, and the diffusion coefficient of hydrogen in an amorphous oxide semiconductor film is $9.0\times10^{-17}$. Therefore, the heating temperature is preferably higher than or equal to 150° C. and lower than or equal to 650° C., more preferably higher than or equal to 200° C. and lower than or equal to 450° C. Further, the heat treatment may also serve as heat treatment in a later step.

Note that in each of the region 103a overlapping with at least the source region, the region 103c overlapping with at least the drain region, the region 107a overlapping with at least the source region, and the region 107c overlapping with at least the drain region, the impurity is preferably contained at higher than or equal to $10^{14}$ atoms/cm$^3$ and lower than or equal to $10^{22}$ atoms/cm$^3$.

Further, in each of the source region 105a and the drain region 105c, the impurity is preferably contained at higher than or equal to $10^{14}$ atoms/cm$^3$ and lower than or equal to $10^{21}$ atoms/cm$^3$. This is because, if the impurity concentration is too high, movement of carriers is inhibited and conductivity is lowered though the resistances of the source region 105a and the drain region 105c can be reduced by adding an impurity ion.

Note that in the case where the source region 105a and the drain region 105c serve as the LDD regions, phosphorus or carbon is preferably used as the impurity because the resistances thereof can be reduced more easily.

As described above, by adding the impurity and performing the heat treatment, hydrogen can be attracted from the oxide semiconductor film 105 and trapped in the insulating film in the vicinity of the oxide semiconductor film, and at the same time, the resistances of the source region 105a and the drain region 105c in the oxide semiconductor film 105 can be reduced. Therefore, by adding the impurity to generate defects, the transistor characteristics and the productivity can be improved.

Note that although FIG. 2C shows an example in which the gate electrode 109 is used as a mask, the present invention is not limited thereto. The impurity 110 may be added after another mask is formed using a photoresist or the like.

By using the above-described materials and manufacturing method, the transistor 201 can be manufactured.

Embodiment 2

In this embodiment, structures of a semiconductor device according to one embodiment of the present invention, which are different from the structure in Embodiment 1, are described with reference to FIGS. 3A to 3C and FIGS. 4A to 4C. Differences from the semiconductor device in Embodiment 1 are mainly described below. Refer to Embodiment 1 for other parts.

Figure 3A:
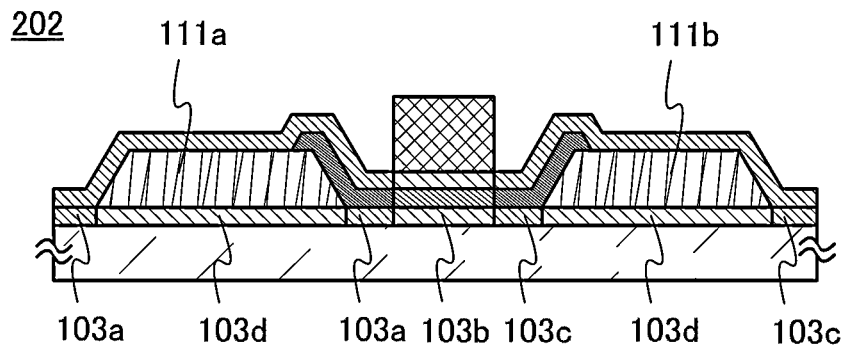
FIGS. 3A to 3C illustrate a semiconductor device according to one embodiment of the present invention.

A transistor 202 shown in FIG. 3A is obtained by adding a source electrode 111a and a drain electrode 111b to the transistor 201 shown in FIG. 1B. The source region 105a is electrically connected to the source electrode 111a. The drain region 105c is electrically connected to the drain electrode 111b.

In the transistor 202, the oxide semiconductor film 105 is provided over the source electrode 111a and the drain electrode 111b. In this case, in the insulating film 103, the impurity concentrations and the hydrogen concentrations in regions 103d overlapping with the source electrode 111a and the drain electrode 111b might be lower than those in the region 103a overlapping with at least the source region and the region 103c overlapping with at least the drain region.

Figure 3B:
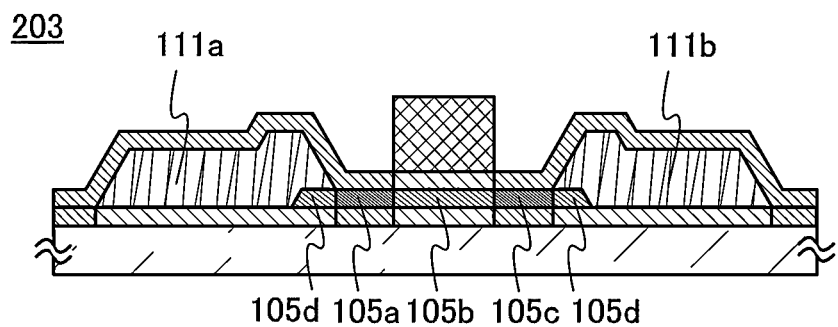

As in a transistor 203 shown in FIG. 3B, the source electrode 111a and the drain electrode 111b may be provided over the oxide semiconductor film 105. In this case, in the oxide semiconductor film 105, the impurity concentrations in regions 105d overlapping with the source electrode 111a and the drain electrode 111b might be lower than the impurity concentrations in the source region 105a and the drain region 105c.

Figure 3C:
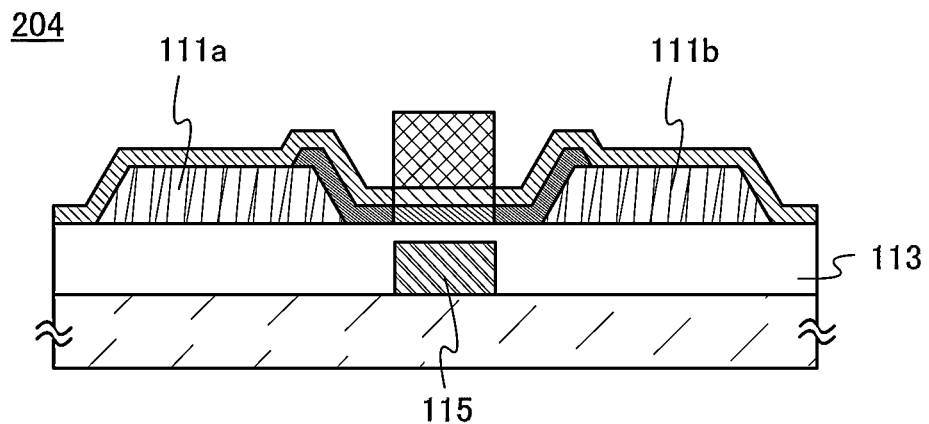

As in a transistor 204 shown in FIG. 3C, a conductive layer 115 may be provided under the oxide semiconductor film 105 with an insulating film 113 provided therebetween. The conductive layer 115 can also be referred to as a back gate.

The insulating film 113 can be formed using a material and a formation method which are similar to those of the insulating film 103.

The conductive layer 115 can be formed using a material and a formation method which are similar to those of the gate electrode 109. The conductive layer 115 may be electrically insulated to be in a floating state, or may be in a state where a potential is supplied from another element. In the latter case, a potential with the same level as that applied to the gate electrode 109 may be applied to the conductive layer 115, or a fixed potential such as a ground potential may be applied to the conductive layer 115. The level of a potential applied to the conductive layer 115 is controlled, so that the threshold voltage of the transistor 201 can be controlled. Note that in the case of controlling the level of a potential to be applied to the conductive layer 115, metal oxide containing nitrogen is used, whereby the threshold voltage of the transistor 204 can be positive, and what is called a normally-off switching element can be obtained more easily.

Figure 4A:
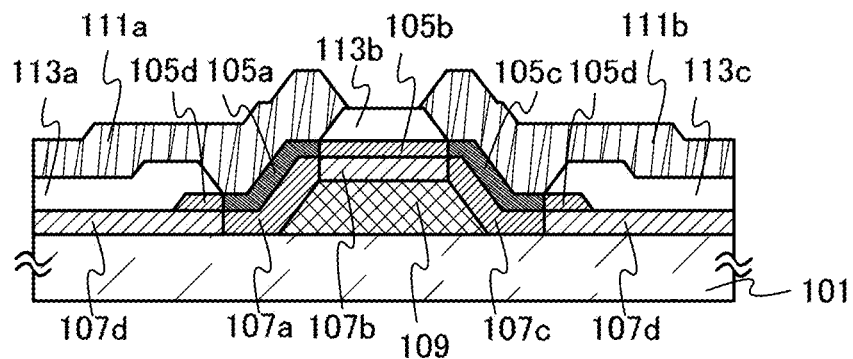
FIGS. 4A to 4C illustrate a semiconductor device according to one embodiment of the present invention.

The stacking order of the components of the transistor may be changed as in a transistor 205 shown in FIG. 4A. The transistor 205 includes, over the substrate 101, the gate electrode 109 and the oxide semiconductor film 105. The oxide semiconductor film 105 overlaps with the gate electrode 109 with the gate insulating film 107 provided therebetween. Further, an insulating film 113a, an insulating film 113b, and an insulating film 113c may be included over the oxide semiconductor film 105.

The oxide semiconductor film 105 includes the source region 105a, the drain region 105c, and the channel formation region 105b sandwiched between the source region 105a and the drain region 105c. Further, the regions 105d overlapping with the insulating film 113a and the insulating film 113c may be included.

In the case of using a structure including the oxide semiconductor film 105 over the gate electrode 109 as in the transistor 205, the insulating film 113b can inhibit damage due to etching or the like at the time of processing the source electrode 111a and the drain electrode 111b.

Further, with the insulating film 113a and the insulating film 113c provided to cover the edge portion of the oxide semiconductor film 105, the edge portion of the oxide semiconductor film 105 can be protected. Oxygen vacancies are easily generated in the edge portion of the oxide semiconductor film processed into an island-like shape. Therefore, by protecting the edge portion, increase in carrier density due to oxygen vacancies and occurrence of a parasitic channel due to the increase in carrier density can be prevented. Note that in the case of providing the insulating film 113a and the insulating film 113c, in the oxide semiconductor film 105, the impurity concentrations in the regions 105d overlapping with the insulating film 113a and the insulating film 113c might be lower than the impurity concentrations in the source region 105a and the drain region 105c.

In the case where damage occurring in processing the source electrode 111a and the drain electrode 111b or a parasitic channel in the edge portion does not cause a problem, the insulating film 113a, the insulating film 113b, and the insulating film 113c are not necessarily formed.

Figure 4B:
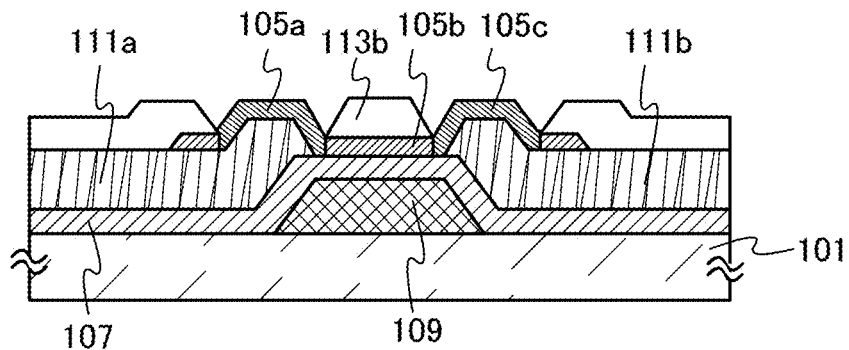

As in a transistor 206 shown in FIG. 4B, the source electrode 111a and the drain electrode 111b may be provided under the oxide semiconductor film 105.

Figure 4C:
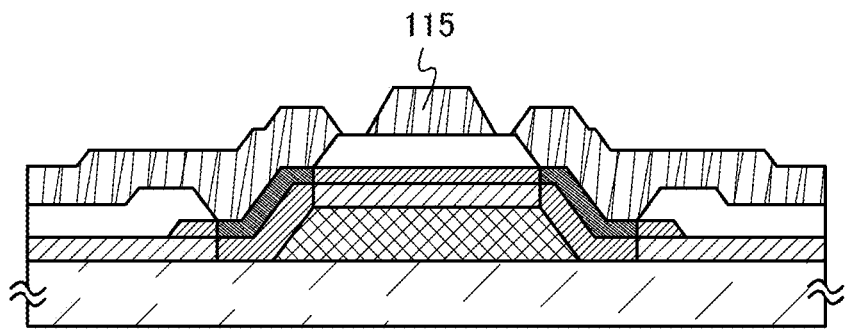

As in a transistor 207 shown in FIG. 4C, the conductive layer 115 may be provided over the oxide semiconductor film 105.

The conductive layer 115 in the transistor 207 of FIG. 4C has an effect similar to that of the conductive layer 115 in the transistor 204 of FIG. 3C and may be referred to as a back gate. A material and a manufacturing method which are similar to those of the conductive layer 115 in the transistor 204 can be used. The conductive layer 115 in FIG. 4C may be formed using the same conductive layer as the source electrode 111a and the drain electrode 111b.

This embodiment can be implemented in appropriate combination with the structures described in the other embodiments.

Embodiment 3

In this embodiment, examples of a semiconductor device which includes the semiconductor device described in any of Embodiments 1 and 2 and is capable of reducing power consumption are described with reference to FIGS. 5A and 5B, FIGS. 6A and 6B, FIGS. 7A and 7B, and FIGS. 8A and 8B.

<Semiconductor Device 1>

Figure 5A:
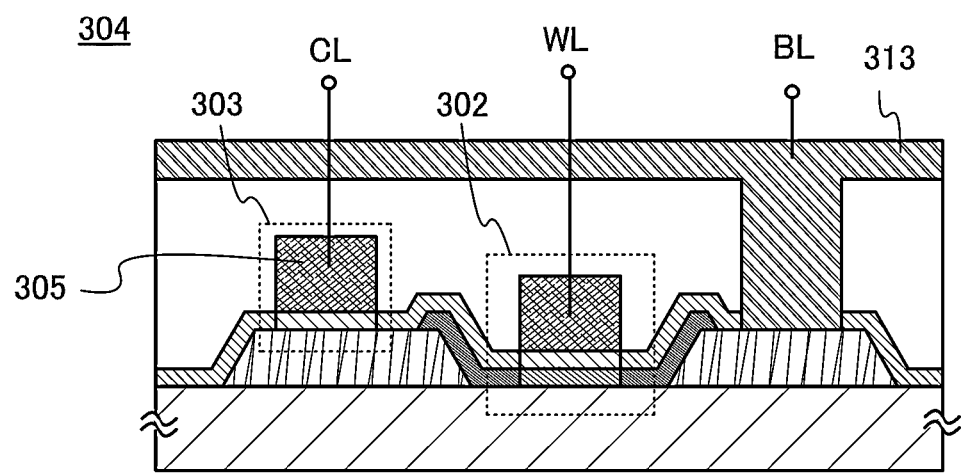
FIGS. 5A and 5B illustrate a semiconductor device according to one embodiment of the present invention.
Figure 5B:
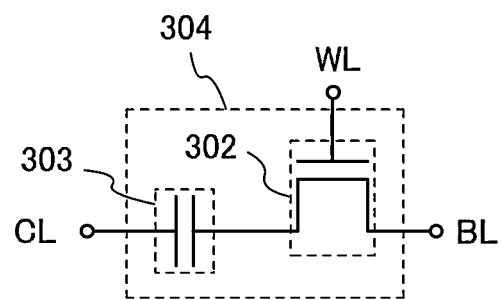

First, an example of a semiconductor device including a memory cell 304 having a transistor 302 and a capacitor 303 is described with reference to FIGS. 5A and 5B. FIG. 5A is a cross-sectional view of the memory cell 304. FIG. 5B is a circuit diagram of the memory cell 304.

The transistor 302 shown in FIGS. 5A and 5B can have a structure similar to that of the transistors 201 to 207 described in Embodiments 1 and 2.

As shown in FIG. 5A, an electrode 305 is formed over a drain electrode of the transistor 302 with an insulating film provided therebetween; thus, the capacitor 303 is formed. That is, the drain electrode of the transistor 302 also serves as one electrode of the capacitor 303. For a material and a formation method of the electrode 305, the description of the gate electrode 109 can be referred to.

As shown in FIG. 5B, the memory cell 304 includes the transistor 302 and the capacitor 303. A gate electrode of the transistor 302 is electrically connected to a word line, and a source electrode of the transistor 302 is electrically connected to a bit line. The other electrode of the capacitor 303 is electrically connected to a capacitor line CL.

The memory cell 304 can be used as an element of a dynamic random access memory (DRAM) by accumulating charge in the drain electrode of the transistor 302 and the one electrode of the capacitor 303. The transistor 302 is the transistor including an oxide semiconductor which is described in any of Embodiments 1 and 2, and the off-state current of the transistor 302 is significantly small. Therefore, charge can be held for a long time. In other words, the frequency of refresh operation can be extremely lowered, which leads to a sufficient reduction in power consumption.

Figure 6A:
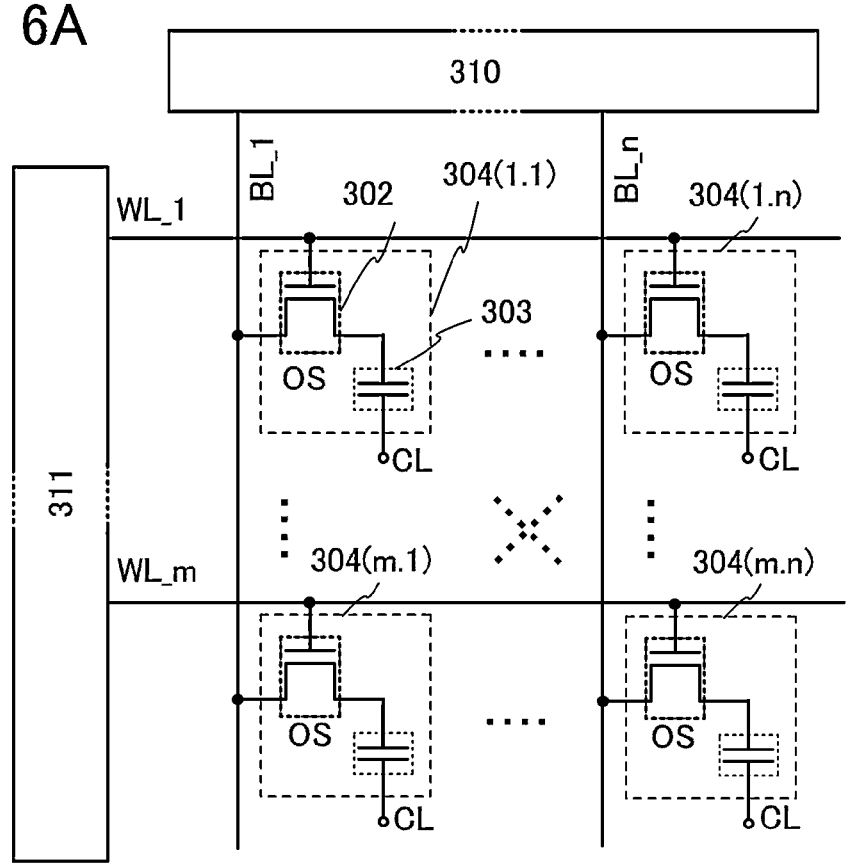
FIGS. 6A and 6B illustrate a semiconductor device according to one embodiment of the present invention.

FIG. 6A illustrates an example of a semiconductor device including a plurality of memory cells 304. The semiconductor device shown in FIG. 6A includes n bit lines BL, m word lines WL, a memory cell array having the memory cells 304 arranged in a matrix of m (rows)×n (columns), a capacitor line CL connected to each memory cell 304, a first driver circuit 310 connected to the n bit lines BL, and a second driver circuit 311 connected to the m word lines WL.

Writing and holding of data in the semiconductor device (e.g., a memory cell 304(1,1)) shown in FIG. 6A are described below.

First, the capacitor line CL is set at a ground potential, and the potential of the word line WL is set to a potential at which the transistor 302 is on, so that the transistor 302 is turned on. Accordingly, the potential of the bit line BL is supplied to the one electrode of the capacitor 303 (writing). After that, the potential of the word line WL is set to a potential at which the transistor 302 is off, so that the transistor 302 is turned off. Thus, the potential of the one electrode of the capacitor 303 is held (holding).

Secondly, reading of data is described. The bit line BL is precharged to $V_{B0}$ and then brought into a floating state, and the transistor 302 is turned on, whereby the bit line BL and the capacitor 303 are electrically connected to each other, and the charge is redistributed between the bit line BL and the capacitor 303. As a result, the potential of the bit line BL is changed. The amount of change in potential of the bit line BL varies depending on the potential of the one electrode of the capacitor 303 (or the charge accumulated in the capacitor 303).

For example, the potential of the bit line BL after charge redistribution is $(C_B \times V_{B0} + C \times V)/(C_B + C)$, where V is the potential of the one electrode of the capacitor 303, C is the capacitance of the capacitor 303, $C_B$ is the capacitance of the bit line BL (hereinafter also referred to as bit line capacitance), and $V_{BO}$ is the potential of the bit line BL before the charge redistribution. Therefore, it can be found that assuming that the memory cell 304 is in either of two states in which the potentials of the one electrode of the capacitor 303 are $V_1$ and $V_0$ ($V_1 > V_0$), the potential of the bit line BL in the case of holding the potential $V_1$ ($=(C_B \times V_{B0} + C \times V_1)/(C_B + C)$) is higher than the potential of the bit line BL in the case of holding the potential $V_0$ ($=(C_B \times V_{B0} + C \times V_0)/(C_B + C)$).

Then, by comparing the potential of the bit line BL with a predetermined potential, data can be read.

The semiconductor device shown in FIG. 6A can hold charge that is accumulated in the capacitor 303 for a long time because the off-state current of the transistor 302 is significantly small. In other words, power consumption can be adequately reduced because refresh operation becomes unnecessary or the frequency of refresh operation can be extremely lowered.

Next, the semiconductor device shown in FIG. 6B will be described.

Figure 6B:
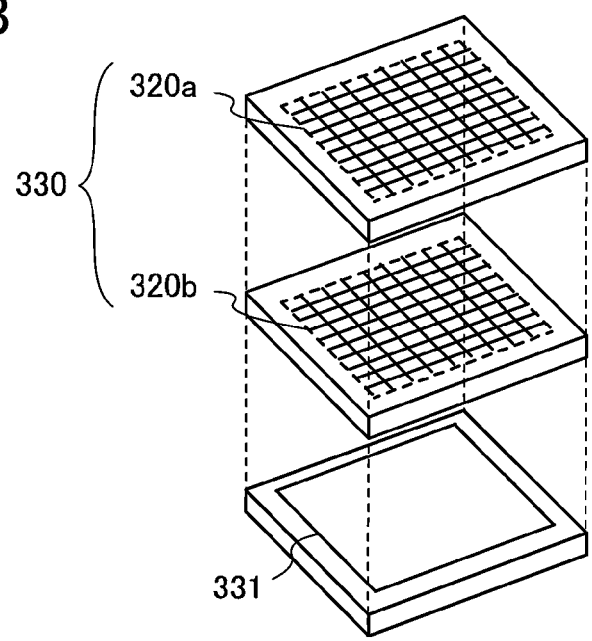

The semiconductor device shown in FIG. 6B includes memory cell arrays 320a and 320b including a plurality of memory cells 304 shown in FIG. 6A as memory circuits in an upper portion, and a peripheral circuit 331 in a lower portion which is necessary for operating memory cell array 330 (memory cell arrays 320*a* and 320*b*). Note that the peripheral circuit 331 is electrically connected to the memory cell arrays 320*a* and 320*b*.

The transistor 302 and the capacitor 303 in the memory cell 304 can be formed using thin films; therefore, the memory cell array 330 can be formed by stacking the memory cell arrays 320*a* and 320*b* as shown in FIG. 6B.

With the structure shown in FIG. 6B, the peripheral circuit 331 and the memory cell array 330 (the memory cell arrays 320*a* and 320*b*) can be provided to overlap with each other. Accordingly, the size of the semiconductor device can be reduced.

It is preferable that a semiconductor material of a transistor provided in the peripheral circuit 331 be different from that of the transistor 302. For example, silicon, germanium, silicon germanium, silicon carbide, gallium arsenide, or the like can be used, and a single crystal semiconductor is preferably used. Alternatively, an organic semiconductor material or the like may be used. A transistor including such a semiconductor material can operate at sufficiently high speed. Therefore, a variety of circuits (e.g., a logic circuit or a driver circuit) which needs to operate at high speed can be favorably realized by the transistor.

Note that FIG. 6B illustrates, as an example, the semiconductor device in which the two memory cell arrays (memory cell arrays 320*a* and 320*b*) are stacked; however, the number of memory cell arrays to be stacked is not limited thereto. Three or more memory cell arrays may be stacked.

<Semiconductor Device 2>

Figure 7A:
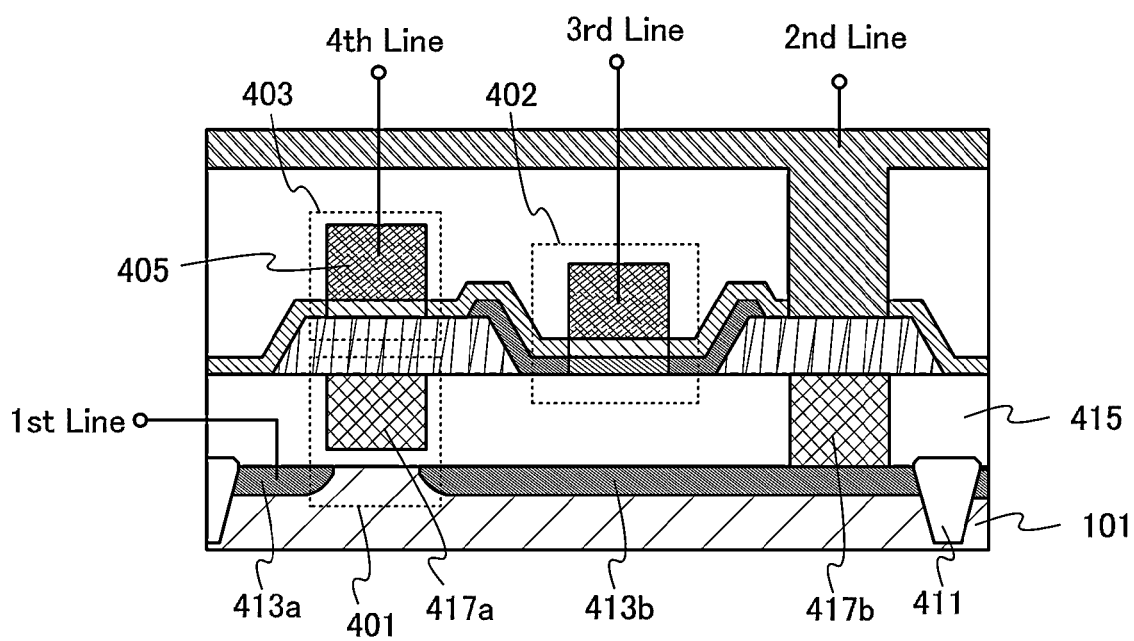
FIGS. 7A and 7B illustrate a semiconductor device according to one embodiment of the present invention.

Next, an example of a semiconductor device which is different from that shown in FIGS. 5A and 5B is described with reference to FIGS. 7A and 7B. FIG. 7A is a cross-sectional view of the semiconductor device, and FIG. 7B is a circuit diagram of the semiconductor device.

Figure 7B:
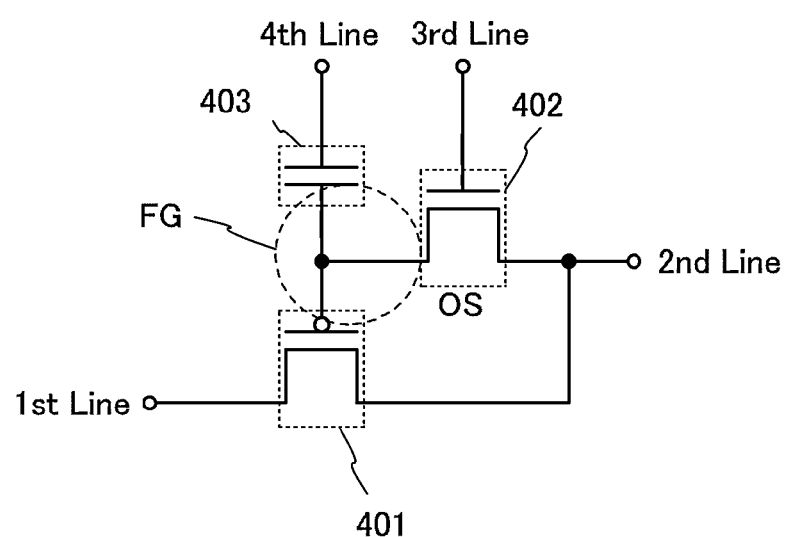

The semiconductor device illustrated in FIGS. 7A and 7B includes a transistor 401 including a first semiconductor material in a lower portion, and a transistor 402 including a second semiconductor material and a capacitor 403 in an upper portion. As the transistor 402, any of the transistors 201 to 207 described in Embodiment 1 and Embodiment 2 can be used.

Here, the first semiconductor material and the second semiconductor material are preferably materials having different band gaps. For example, the first semiconductor material may be a semiconductor material other than an oxide semiconductor (e.g., silicon) and the second semiconductor material may be an oxide semiconductor. A transistor including a material other than an oxide semiconductor can operate at high speed easily. Further, in the transistor including an oxide semiconductor which is described in Embodiment 1 or Embodiment 2, the off-state current can be significantly small. Therefore, charge can be held for a long time in a node (e.g., FG in FIG. 7B) to which the source electrode or the drain electrode of the transistor including an oxide semiconductor is connected.

Hence, the semiconductor device shown in FIGS. 7A and 7B can be used as a memory element by holding charge in a node to which the source electrode or the drain electrode of the transistor including an oxide semiconductor is connected.

Note that the transistor including the first semiconductor material may be either an n-channel transistor or a p-channel transistor. Further, except for the use of the transistor described in any of Embodiments 1 and 2 including an oxide semiconductor for holding data, it is not necessary to specifically limit the constitution of the semiconductor device, such as a material of the semiconductor device or a structure of the semiconductor device, to the structure described here.

The transistor 401 in FIG. 7A includes a channel formation region provided in a substrate 101 including the first semiconductor material (single crystal silicon in FIGS. 7A and 7B), a source region 413*a* and a drain region 413*b* provided such that the channel formation region is sandwiched therebetween, a gate insulating film provided over the channel formation region, and a gate electrode 417*a* provided over the gate insulating film.

Further, an element isolation insulating layer 411 is formed on the substrate 101 to surround the transistor 401, and an insulating layer 415 is provided to cover the transistor 401.

One of a source electrode and a drain electrode of the transistor 402 is electrically connected to the gate electrode 417*a* of the transistor 401. The other of the source electrode and the drain electrode of the transistor 402 is electrically connected to the drain region 413*b* of the transistor 401 via the electrode 417*b*.

An electrode 405, the source electrode of the transistor 402, and a gate insulating layer form the capacitor 403. That is, the electrode 405 serves as one electrode of the capacitor 403, and the source electrode of the transistor 402 serves as the other electrode of the capacitor 403. Note that in the case where a capacitor is not needed, the capacitor 403 may be omitted. Further, the capacitor 403 may be separately provided above the transistor 402.

In FIG. 7A, the transistor 402 and the capacitor 403 are provided to overlap with at least a part of the transistor 402. For example, the electrode 405 of the capacitor 403 is provided to overlap with at least a part of the gate electrode of the transistor 401. With such a planar layout, the area occupied by the semiconductor device can be reduced; thus, higher integration can be achieved.

An example of a circuit configuration corresponding to FIG. 7A is illustrated in FIG. 7B.

As shown in FIG. 7B, a first wiring (1st Line) is electrically connected to the source region of the transistor 401. A second wiring (2nd Line) is electrically connected to the drain region of the transistor 401 and the drain electrode of the transistor 402. A third wiring (3rd Line) is electrically connected to a gate electrode of the transistor 402. A fourth wiring (4th Line) is electrically connected to the one electrode of the capacitor 403. The gate electrode of the transistor 401 and the source electrode of the transistor 402 are electrically connected to the other electrode of the capacitor 403.

Note that in FIGS. 7A and 7B, the drain region 413*b* of the transistor 401 and the drain electrode of the transistor 402 are electrically connected to each other, but the present invention is not limited thereto. The drain region 413*b* of the transistor 401 and the drain electrode of the transistor 402 may be connected to different wirings.

The semiconductor device in FIG. 7B utilizes a characteristic in which the potential of the gate electrode of the transistor 401 (FG in FIG. 7B) can be held, and thus enables data writing, holding, and reading as follows.

Writing and holding of data is described. First, the potential of the third wiring is set to a potential at which the transistor 402 is on, so that the transistor 402 is turned on. Accordingly, the potential of the second wiring is supplied to the gate electrode of the transistor 401 and to the other electrode (FG) of the capacitor 403. In other words, a predetermined charge is supplied to the gate electrode of the transistor 401 (i.e., writing of data). Here, charge for supply of a potential level or charge for supply of a different potential level (hereinafter referred to as Low level charge and High level charge) is given. After that, the potential of the third wiring is set to a potential at which the transistor 402 is off, so that the transistor 402 is turned off. Thus, the charge supplied to the gate electrode of the transistor 401 is held (holding).

Since the off-state current of the transistor 402 is significantly small, the charge of the gate electrode of the transistor 401 is held for a long time.

Next, reading of data is described. By supplying an appropriate potential (reading potential) to the fourth wiring with a predetermined potential (constant potential) supplied to the first wiring, the potential of the second wiring varies depending on the amount of charge held in the gate electrode of the transistor 401. This is because in general, when the transistor 401 is a p-channel transistor, an apparent threshold voltage $V_{th\_H}$ in the case where High-level charge is supplied to the gate electrode of the transistor 401 is lower than an apparent threshold voltage $V_{th\_L}$ in the case where Low-level charge is supplied to the gate electrode of the transistor 401. Here, the apparent threshold voltage refers to the potential of the fourth wiring, which is needed to turn on the transistor 401. Thus, the potential of the fourth wiring is set to a potential $V_0$ that is between $V_{th\_H}$ and $V_{th\_L}$, whereby charge applied to the gate electrode of the transistor 401 can be determined. For example, in the case where a High-level charge is given in writing, when the potential of the fourth wiring is set to $V_0$ ($<V_{th\_L}$), the transistor 401 is turned off. In the case where a Low-level charge is given in writing, the potential of the fourth wiring is set to $V_0$ ($>V_{th\_H}$), so that the transistor 401 is turned on. Therefore, the stored data can be read by the potential of the second wiring.

Note that in the case where memory cells are arrayed to be used, only data of desired memory cells needs to be read. In the case where such reading is not performed, a potential at which the transistor 401 is turned off regardless of the state of the gate electrode thereof, that is, a potential higher than $V_{th\_L}$ may be given to the fourth wiring. Alternatively, a potential at which the transistor 401 is turned on regardless of the state of the gate electrode thereof, that is, a potential lower than $V_{th\_H}$ may be given to the capacitor line CL.

The transistor 401 including single crystal silicon can operate at high speed. Thus, when the transistor is used as a reading transistor, data can be read at a high speed. The transistor 402 is the transistor including an oxide semiconductor which is described in any of Embodiments 1 and 2, and the off-state current of the transistor 402 is significantly small. Therefore, charge can be held for a long time. In other words, power consumption can be sufficiently reduced because a semiconductor memory device in which refresh operation is unnecessary or the frequency of refresh operation is extremely low can be provided.

In FIGS. 7A and 7B, an example of using a metal-oxide-semiconductor (MOS) transistor in the lower portion is illustrated; however, the present invention is not limited thereto. A metal-semiconductor (MES) transistor may be used in the lower portion.

Figure 8A:
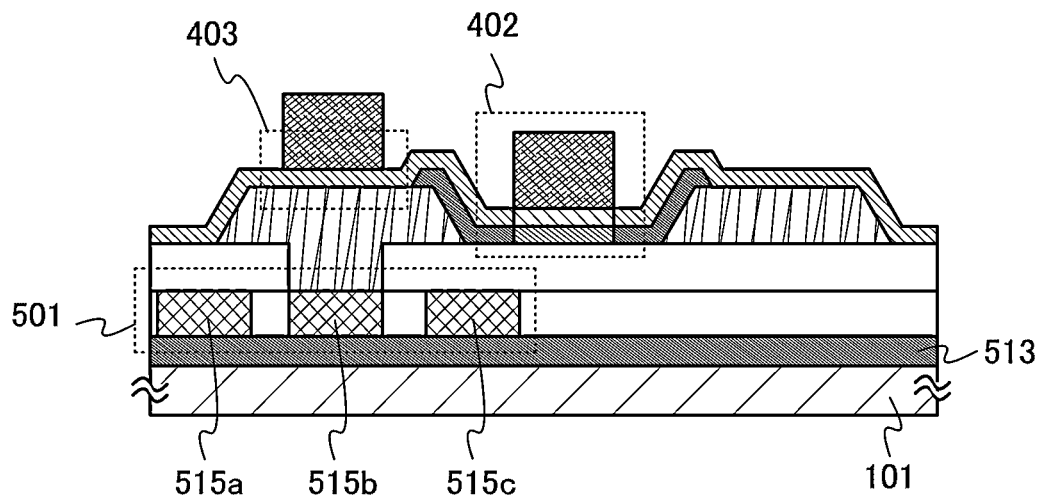
FIGS. 8A and 8B illustrate a semiconductor device according to one embodiment of the present invention.
Figure 8B:
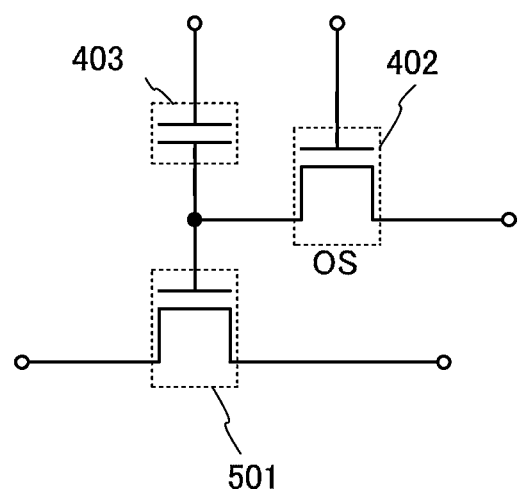

A semiconductor device shown in FIGS. 8A and 8B is an example of using a MES transistor 501 in a lower portion. In this case, as a first semiconductor material used for the lower transistor, a compound semiconductor such as gallium arsenide, indium phosphide, or silicon carbide is preferable.

The semiconductor device shown in FIGS. 8A and 8B includes the MES transistor 501 in the lower portion and the transistor 402 including a second semiconductor material and the capacitor 403 in the upper portion. FIG. 8A is a cross-sectional view of the semiconductor device, and FIG. 8B is a circuit diagram of the semiconductor device.

The transistor 501 includes a semiconductor layer 513, a source electrode 515a, a gate electrode 515b, and a drain electrode 515c over the substrate 101.

In this manner, a semiconductor device having both a peripheral circuit using a transistor including a material other than an oxide semiconductor (in other words, a transistor capable of operating at sufficiently high speed) and a memory device using a transistor including an oxide semiconductor (in a broader sense, a transistor whose off-state current is sufficiently small) can be achieved.

This embodiment can be implemented in appropriate combination with the structures described in the other embodiments.

Embodiment 4

In this embodiment, examples of a logic circuit including the semiconductor device described in any of Embodiments 1 and 2 is described with reference to FIGS. 9A1, 9A2, 9B, 9C1, 9C2, and 9D.

A logic circuit can be formed using the semiconductor device described in any of Embodiments 1 and 2, e.g., the transistor 204 including an oxide semiconductor and having a back gate, which is shown in FIG. 3C.

As for an input signal A, an input signal B, and an output signal X, "0" corresponds to a low potential and "1" corresponds to a high potential. A back-gate potential Vbg is set to a ground potential, for example. In FIGS. 9A1, 9A2, 9B, 9C1, 9C2, and 9D, an input terminal and an output terminal of each signal and each potential are denoted by the same symbols as each signal and each potential.

At this time, a circuit shown in FIG. 9A1 can serve as an OR circuit, a circuit shown in FIG. 9A2 can serve as a NOR circuit, a circuit shown in FIG. 9C1 can serve as an AND circuit, and a circuit shown in FIG. 9C2 can serve as a NAND circuit.

Figure 9B:
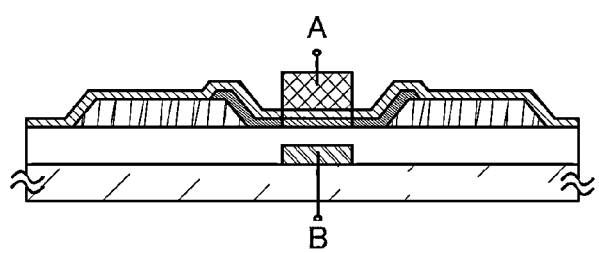
Figure 9D:
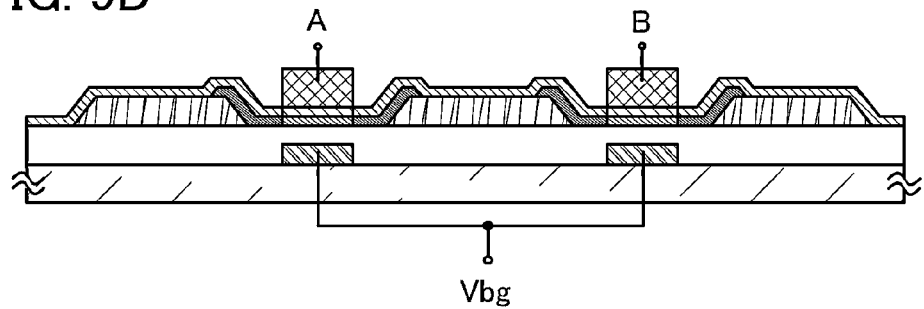

FIG. 9B is a cross-sectional view of a transistor which can be used for the circuit diagrams of FIGS. 9A1 and 9A2. FIG. 9D is a cross-sectional view of a transistor which can be used for the circuit diagrams of FIGS. 9C1 and 9C2.

This embodiment can be implemented in appropriate combination with the structures described in the other embodiments.

Example 1

In this example, crystallinity of a region of an oxide semiconductor film to which an impurity was not added and crystallinity of a region of the oxide semiconductor film to which an impurity was added were compared with the use of a transmission electron microscope (TEM).

<Formation Conditions of Sample>

First, the formation conditions of a sample are described.

A silicon substrate having 5 inches on each side was used as a substrate.

A 300 nm thick silicon oxynitride film was formed as a base insulating film over the substrate. The base insulating film was formed by a CVD method.

An oxide semiconductor film was formed to a thickness of 30 nm over the base insulating film. The oxide semiconductor film was formed by a sputtering method under the following conditions: a target where In:Ga:Zn=1:1:1 (atomic ratio) was used; the pressure was 0.4 Pa; the power was 0.5 kW; the flow rate was Ar:$O_2$=2:1 (volume ratio); and the substrate temperature was 400° C.

Heat treatment was performed on the substrate provided with the oxide semiconductor film. The heat treatment was performed under an $N_2$ atmosphere at 450° C. for 1 hour.

Nitrogen or argon was added as an impurity to the substrate subjected to the heat treatment. An ion implantation method was used for adding the impurity. In the case of nitrogen, the amount of added nitrogen was $5.0 \times 10^{16}$ ions/cm$^2$, and the voltage was set to 10 kV. In the case of argon, the amount of added argon was $1.0 \times 10^{16}$ ions/cm$^2$, and the voltage was set to 25 kV.

An impurity profile in the oxide semiconductor film to which the impurity was added under the above-described conditions was calculated.

The calculation was performed using TRIM-98 under the following conditions.

Figure 10A:
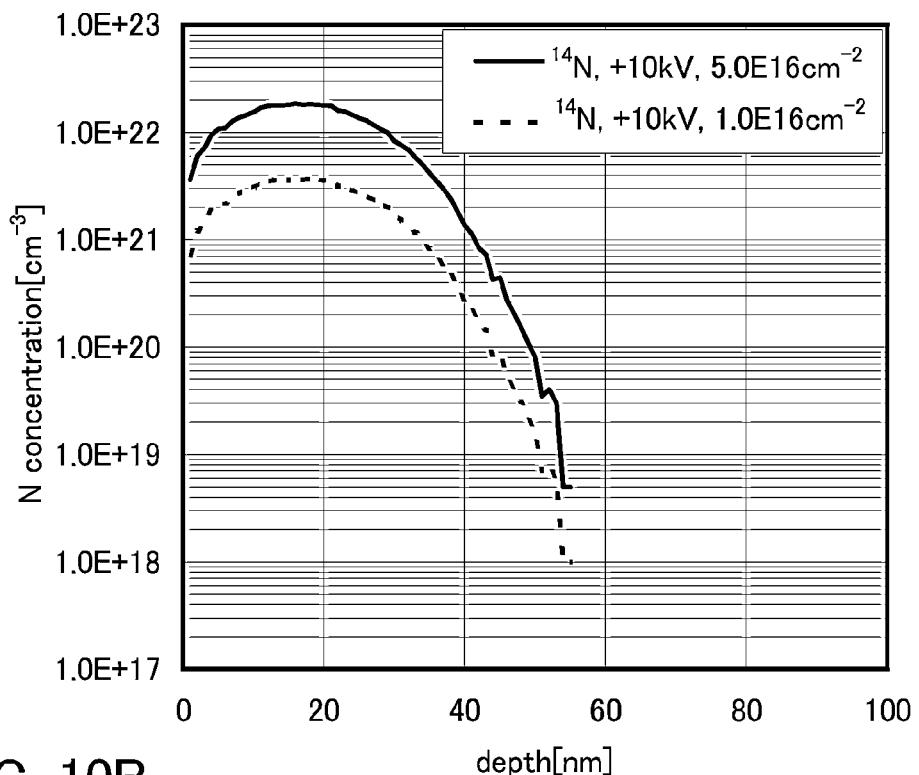
FIGS. 10A and 10B show calculation results of impurity profiles in oxide semiconductor films.
Figure 10B:
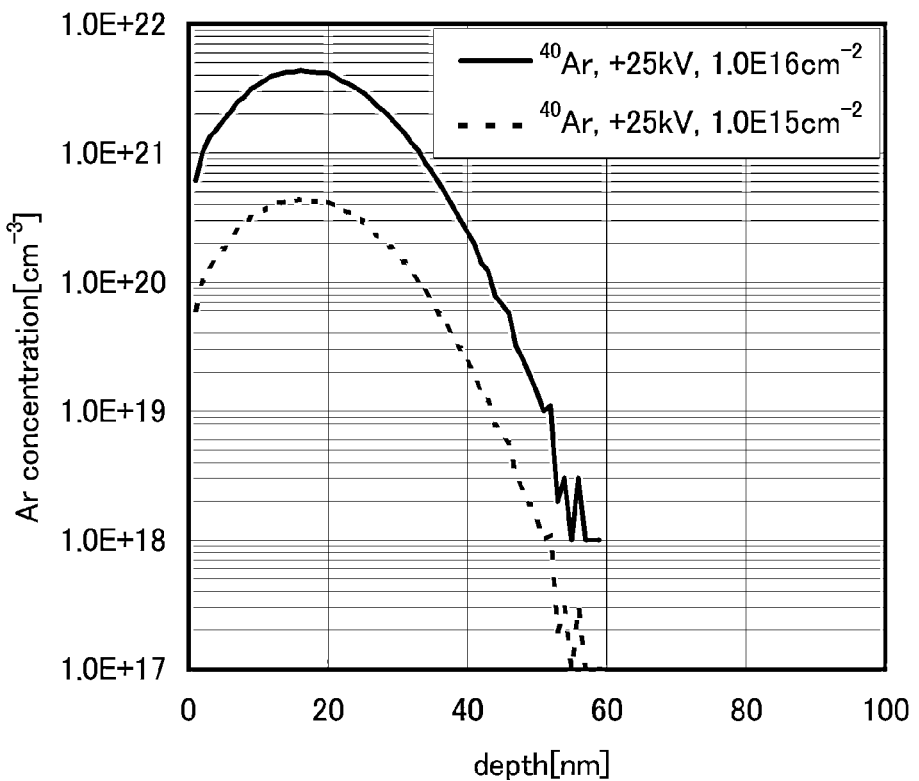

The number of ions
99999
Injection layer
Composition of In:Ga:Zn:O=1:1:1:4 (atomic ratio), density of 6.2 g/cm$^3$
Impurity to be injected, and acceleration voltage and dosage thereof
$^{14}$N: voltage of 10 kV, $5.0 \times 10^{16}$ ions/cm$^2$
$^{14}$N: voltage of 10 kV, $1.0 \times 10^{16}$ ions/cm$^2$
$^{40}$Ar: voltage of 25 kV, $1.0 \times 10^{16}$ ions/cm$^2$
$^{40}$Ar: voltage of 25 kV, $1.0 \times 10^{15}$ ions/cm$^2$ FIG. 10A shows the calculation result of the case where nitrogen was added as the impurity, and FIG. 10B shows the calculation result of the case where argon was added as the impurity.

<Comparison of Crystallinity>

As for the sample thus formed, crystallinity of a region to which the impurity was not added and crystallinity of a region to which the impurity was added were observed by a TEM. The observation was performed using H-9000NAR at an acceleration voltage of 300 kV and a magnification of 4,000,000 times.

Figure 11:
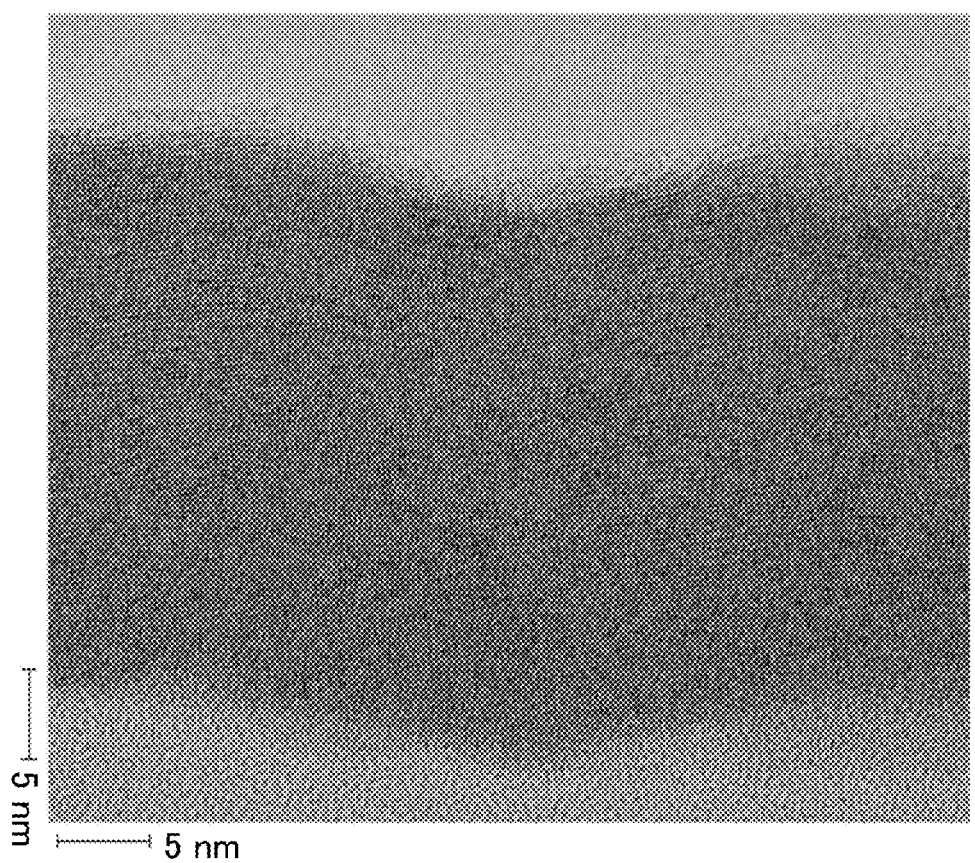
FIG. 11 is a photograph of an oxide semiconductor film which is taken with a transmission electron microscope.
Figure 12:
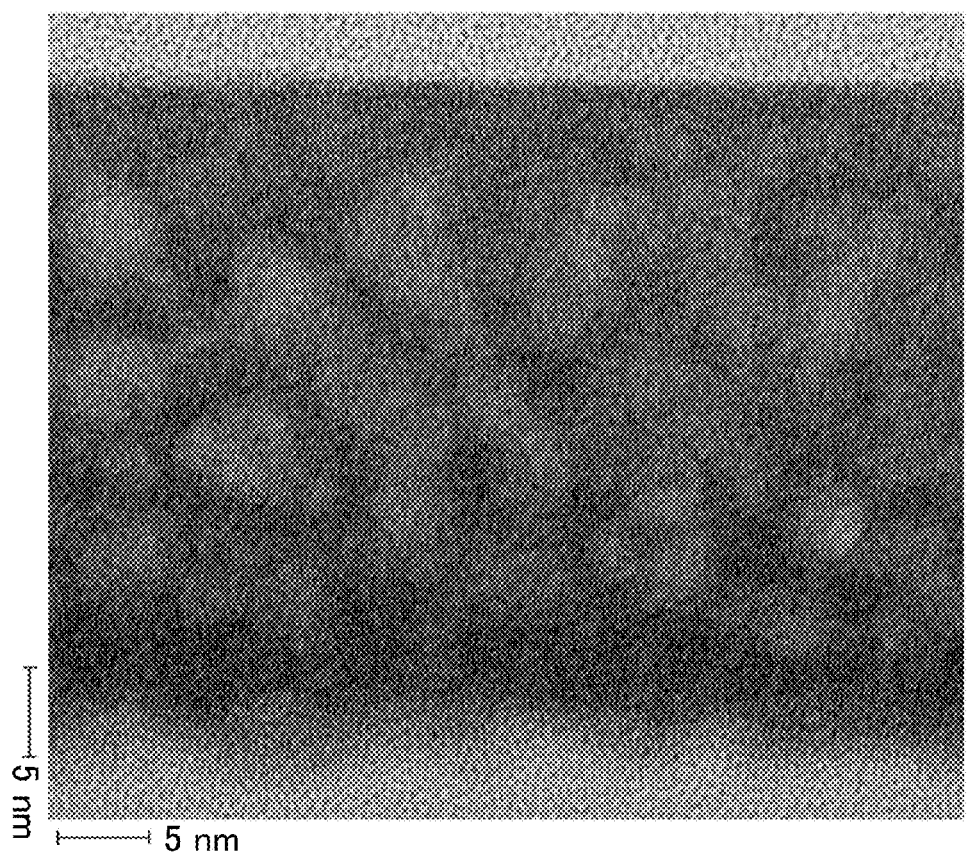
FIG. 12 is a photograph of an oxide semiconductor film which is taken with a transmission electron microscope.
Figure 13:
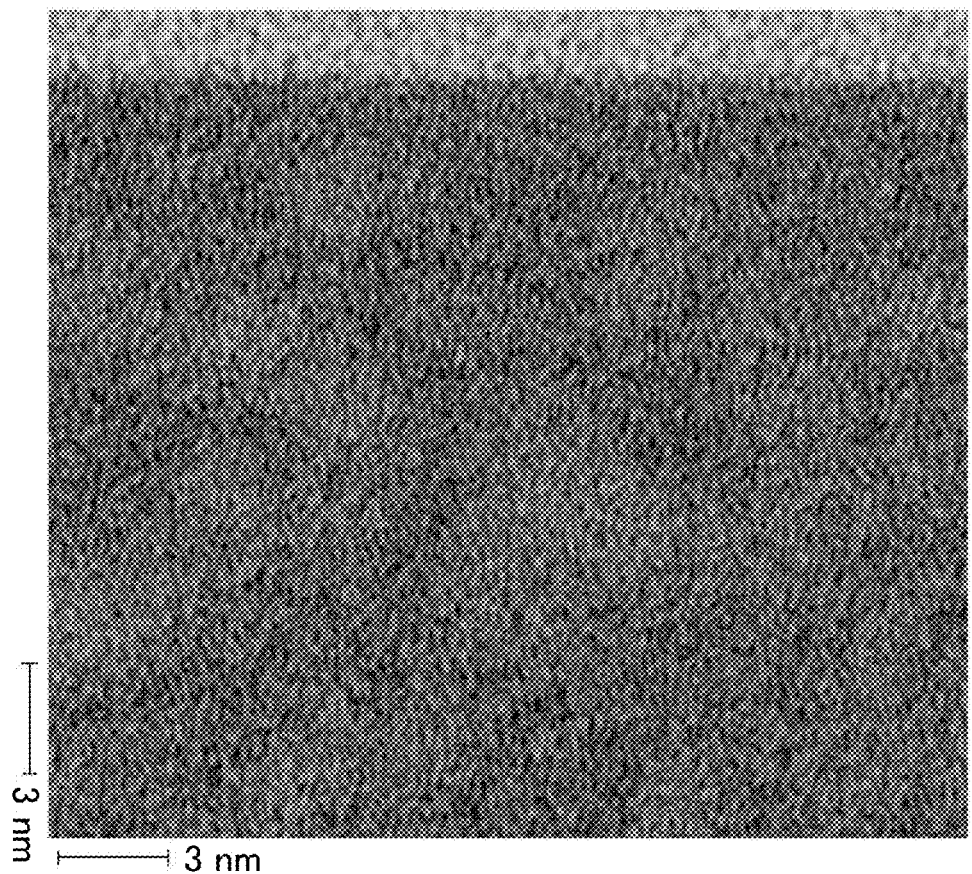
FIG. 13 is a photograph of an oxide semiconductor film which is taken with a transmission electron microscope.

FIG. 11 is a cross-sectional TEM image of a region of the oxide semiconductor film to which the impurity was not added. FIG. 12 is a cross-sectional TEM image of a region of the oxide semiconductor film to which nitrogen was added as the impurity. FIG. 13 is a cross-sectional TEM image of a region of the oxide semiconductor film to which argon was added as the impurity.

It is revealed that, in FIG. 11 showing the region to which the impurity was not added, the oxide semiconductor film is a CAAC-OS film.

In contrast, in each of FIGS. 12 and 13 showing the region to which the impurity was added, crystallinity was not observed in the oxide semiconductor film, and the oxide semiconductor film was amorphous.

The above shows that crystallinity of the oxide semiconductor film is lowered by adding the impurity.

From this example, it is suggested that a transistor in which a source region 105a and a drain region 105c have crystallinity lower than that of a channel formation region 105b can be manufactured when the source region 105a and the drain region 105c are formed using the region to which the impurity was added and the channel formation region 105b is formed using the region to which the impurity was not added.

Example 2

In this example, an impurity was added to a part of an oxide semiconductor film, whereby a region to which the impurity was not added and a region to which the impurity was added were formed to be adjacent to each other, and the hydrogen concentrations in the regions were measured by three-dimensional secondary ion mass spectrometry (3D-SIMS).

<Formation Conditions of Sample>

First, the formation conditions of a sample are described.

A silicon substrate having 5 inches on each side was used as a substrate.

A 100 nm thick silicon oxide film was formed as a base insulating film over the substrate. The silicon oxide film was formed by oxidizing silicon of the substrate by heating.

An oxide semiconductor film was formed to a thickness of 300 nm over the base insulating film. The oxide semiconductor film was formed by a sputtering method under the following conditions: a target where In:Ga:Zn=1:1:1 (atomic ratio) was used; the pressure was 0.5 Pa; the power was 0.5 kW; the flow rate was Ar:O$_2$=2:1 (volume ratio); and the substrate temperature was 400° C.

Next, the oxide semiconductor film was processed into an island-like shape by etching.

In the oxide semiconductor film processed into the island-like shape, a region to which an impurity was not to be added was protected by being coated with a photoresist.

Next, an impurity was added to the oxide semiconductor film which was partly protected with the photoresist. As the impurity, nitrogen was added by an ion implantation method at an acceleration voltage of 100 kV and a dosage of $2.0 \times 10^{16}$/cm$^2$.

After the impurity was added, the photoresist was removed by O$_2$ ashing.

An insulating film was formed over the oxide semiconductor film from which the photoresist was removed. A 100 nm thick silicon nitride film was used as the insulating film.

After the insulating film was formed, heat treatment was performed. The heat treatment was performed under a nitrogen atmosphere at 450° C. for 1 hour.

<Comparison of Hydrogen Concentration>

Figure 14:
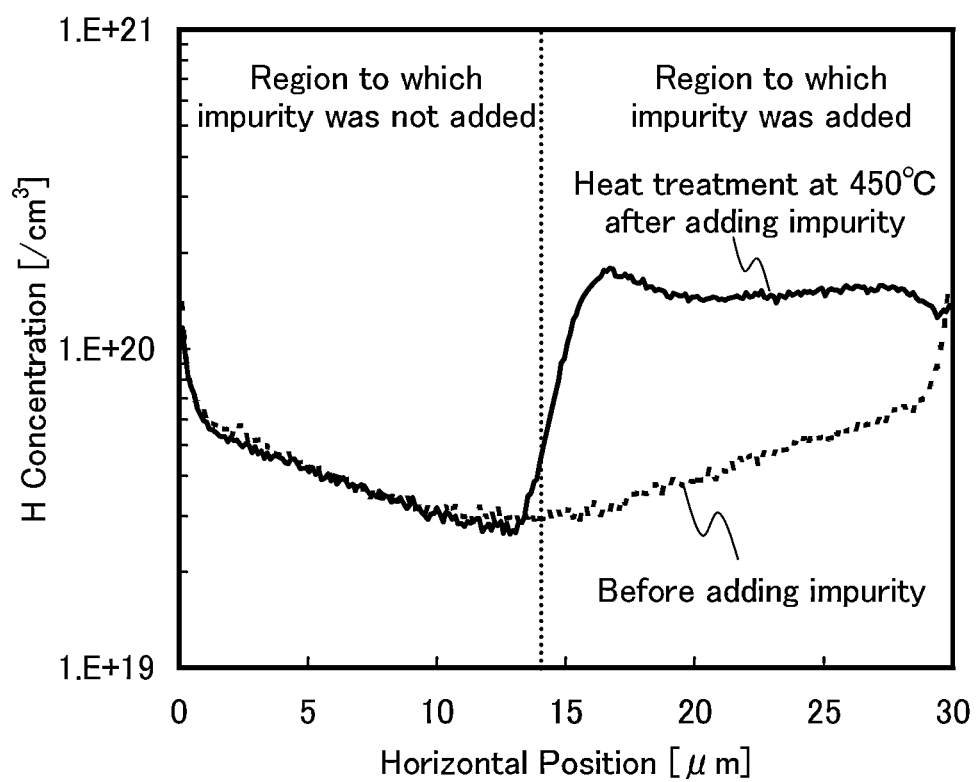
FIG. 14 shows 3D-SIMS profiles of an oxide semiconductor film.

As for the sample thus formed, hydrogen concentration in the vicinity of the boundary between the region to which the impurity was not added and the region to which the impurity was added was measured by 3D-SIMS. A solid line in FIG. 14 represents a hydrogen line profile of the sample. A dashed line in FIG. 14 represents, as a reference, a hydrogen line profile of a sample to which the impurity was not added.

The measurement was performed using CAMECA IMS-7f, with Cs$^+$ as primary ions, a primary acceleration voltage of 15.0 kV, and a measurement region of 30 μm×30 μm. Values of the line profiles are obtained by integration in the depth direction and averaging with respect to volume.

The above shows that the hydrogen concentration in the region to which the impurity was added is higher than the hydrogen concentration in the region to which the impurity was not added.

From this example, it is suggested that a transistor having a source region 105a and a drain region 105c each including a high proportion of hydrogen can be manufactured in the case where the source region 105a and the drain region 105c are formed using the region to which an impurity ion was added and a channel formation region 105b is formed using the region to which the impurity ion was not added.

Example 3

In this example, insulating films were formed on a lower surface and an upper surface of an oxide semiconductor film, and in the insulating films, a region to which an impurity was not added and a region to which an impurity was added were formed. Then, the hydrogen concentrations in these regions were measured by secondary ion mass spectrometry (SIMS).

<Formation Conditions of Sample>

First, the formation conditions of a sample are described.

A silicon substrate having 5 inches on each side was used as a substrate.

A 100 nm thick silicon oxide film was formed as a base insulating film over the substrate. The silicon oxide film was formed by oxidizing silicon of the substrate by heating.

An oxide semiconductor film was formed to a thickness of 100 nm over the base insulating film. The oxide semiconductor film was formed by a sputtering method under the following conditions: a target where In:Ga:Zn=1:1:1 (atomic ratio) was used; the pressure was 0.4 Pa; the power was 0.2 kW; the flow rate was $Ar:O_2=2:1$ (volume ratio); and the substrate temperature was 400° C.

Next, the oxide semiconductor film was processed into an island-like shape by etching.

In the oxide semiconductor film processed into the island-like shape, a region to which an impurity was not to be added was protected by being coated with a photoresist.

Next, an impurity was added to the oxide semiconductor film which was partly protected with the photoresist. As the impurity, nitrogen or argon was added by an ion implantation method. In the case of adding nitrogen, the acceleration voltage was 35 kV and the dosage was $5.0\times10^{16}/cm^2$. In the case of adding argon, the acceleration voltage was 100 kV and the dosage was $1.0\times10^{16}/cm^2$.

After the impurity was added, the photoresist was removed by $O_2$ ashing.

An insulating film was formed over the oxide semiconductor film from which the photoresist was removed. As the insulating film, 100-nm-thick aluminum oxide was used. The aluminum oxide was formed by a sputtering method under the following conditions: the flow rate was $Ar:O_2=1:1$ (volume ratio); the pressure was 0.4 Pa; the power was 2.5 kW; and the substrate temperature was 250° C.

After the insulating film was formed, heat treatment was performed. The heat treatment was performed under a nitrogen atmosphere at 450° C. or 650° C. for 1 hour.

<Comparison of Hydrogen Concentration>

As for the sample thus formed, hydrogen concentration in the vicinity of the boundary between the region to which the impurity was not added and the region to which the impurity was added was measured by 3D-SIMS. The measurement was performed using CAMECA IMS-7f, with $Cs^+$ as primary ions, a primary acceleration voltage of 15.0 kV, and a measurement region of 30 μm×30 μm.

Hydrogen profiles are shown in FIGS. 15A to 15C and FIGS. 16A to 16C. In these figures, a dashed line represents a hydrogen profile of the region to which the impurity was not added, and a solid line represents a hydrogen profile of the region to which the impurity was added.

Figure 15A:
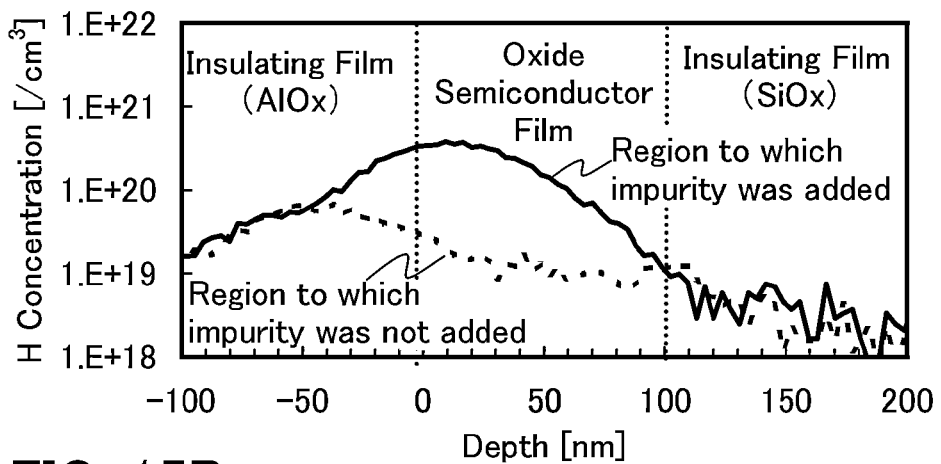
FIGS. 15A to 15C show SIMS profiles of oxide semiconductor films and insulating films.
Figure 15B:
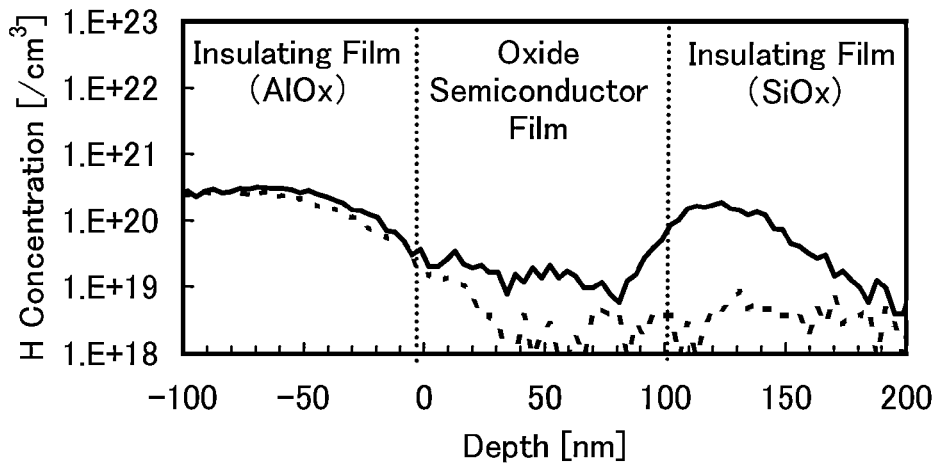
Figure 15C:
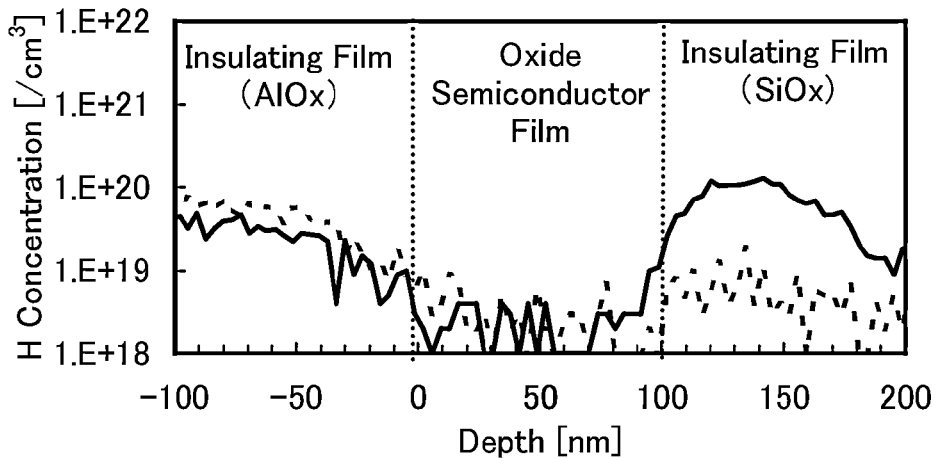

FIGS. 15A to 15C show hydrogen profiles of samples to which nitrogen was added as the impurity. FIG. 15A shows hydrogen profiles of a sample which was subjected to the addition of nitrogen and was not subjected to heat treatment, as a reference. FIG. 15B shows hydrogen profiles of a sample which was subjected to the addition of nitrogen and then heated at 450° C. FIG. 15C shows hydrogen profiles of a sample which was subjected to the addition of nitrogen and then heated at 650° C.

Figure 16A:
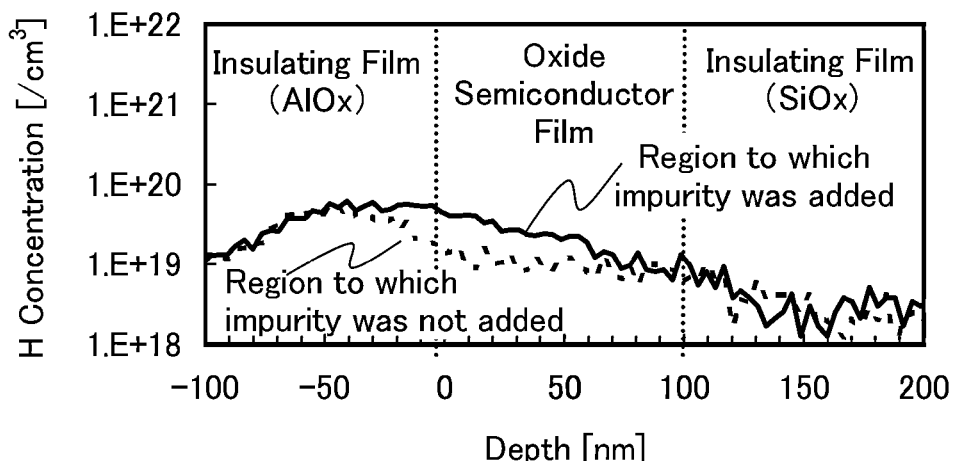
FIGS. 16A to 16C show SIMS profiles of oxide semiconductor films and insulating films.
Figure 16B:
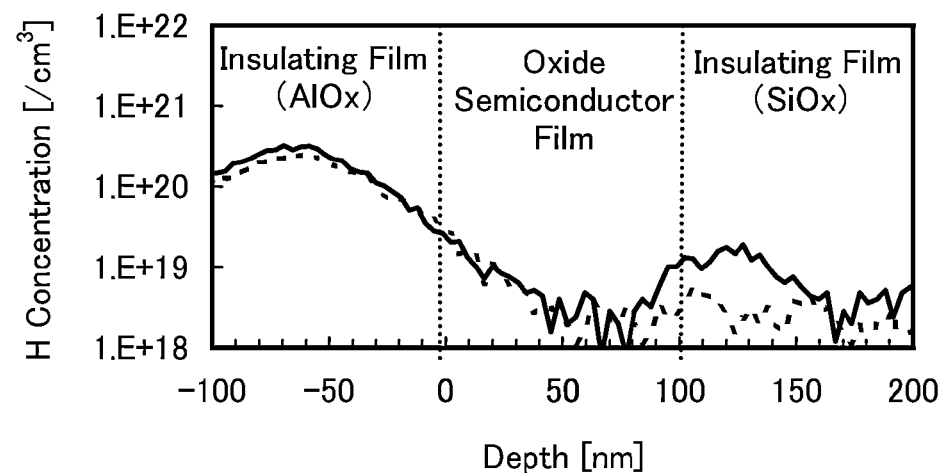
Figure 16C:
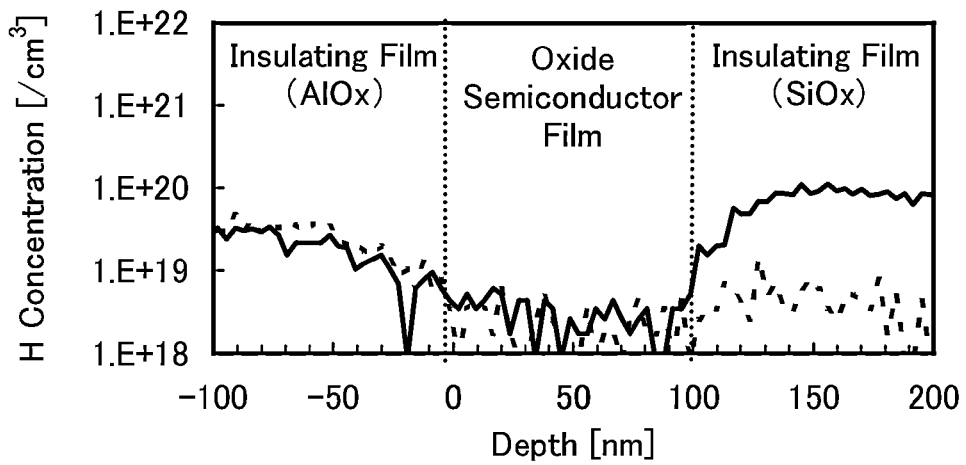

FIGS. 16A to 16C show hydrogen profiles of samples to which argon was added as the impurity. FIG. 16A shows hydrogen profiles of a sample which was subjected to the addition of argon and was not subjected to heat treatment, as a reference. FIG. 16B shows hydrogen profiles of a sample which was subjected to the addition of argon and then heated at 450° C. FIG. 16C shows hydrogen profiles of a sample which was subjected to the addition of argon and then heated at 650° C.

It is revealed from FIGS. 15A to 15C and FIGS. 16A to 16C that, by performing heat treatment at 450° C. or 650° C. on the region to which the impurity was added, the hydrogen concentration in the oxide semiconductor film is decreased and the hydrogen concentration in the insulating film in contact with the oxide semiconductor film is increased.

Thus, it is suggested that hydrogen in the oxide semiconductor film can be attracted to and trapped in the insulating film which was in contact with the oxide semiconductor film and to which an impurity was added to generate a defect.

It is suggested from Examples 1 to 3 that, by generating a defect in an insulating film in contact with a source region and a drain region of an oxide semiconductor film in a transistor including an oxide semiconductor by adding an impurity or the like, hydrogen can be attracted from the oxide semiconductor and trapped. Thus, it is suggested that a transistor with stable threshold voltage and improved reliability which includes an oxide semiconductor can be provided.

Example 4

Evaluation of Optical Properties of Oxide Semiconductor Film

In this example, the evaluation of the optical properties of an oxide semiconductor film (also referred to as an OS film, an IGZO film, or an In—Ga—Zn—O film) is described. Note that in this and subsequent examples, the oxide semiconductor film was deposited by a sputtering method and a target having a composition of In:Ga:Zn=1:1:1 was used.

<Photoresponse Characteristics of Oxide Semiconductor Film>

There are some reports on the photoresponse in an oxide semiconductor film. It is already revealed that after starting light irradiation and then stopping the light irradiation, an oxide semiconductor film shows very slow photoresponse in which current does not relax rapidly and a current value is lowered gradually (Non-patent Document 1: D. H. Lee et al., Electrochemical and Solid State letters, 13 (2010) H324-H327). Regarding this slow relaxation phenomenon, there is a report in which the relaxation of photocurrent may be inhibited by a trap level existing at a deep level of an oxide semiconductor film (Non-patent Document 2: T. Inoue et al., Proc. AM-FPD'10 Digest, 33 (2010); Non-patent Document 3: K. Graffarzadah et al., APPLIED PHYSICS LETTERS 97 143510 (2010)).

Figure 17:
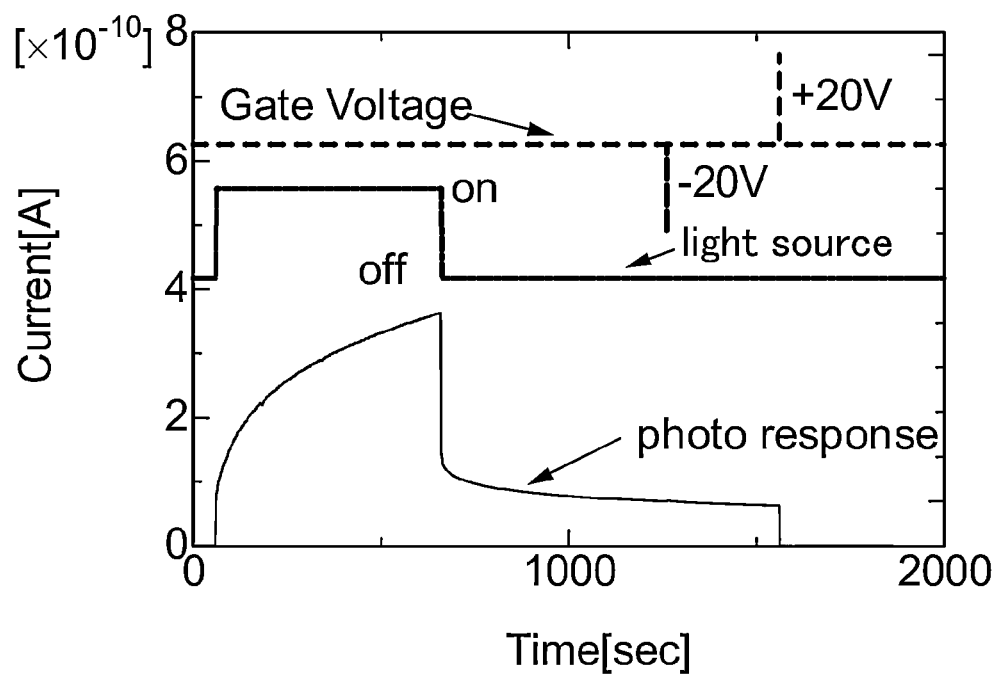
FIG. 17 shows a photoresponse current curve of an oxide semiconductor film.

FIG. 17 shows the results of measuring photocurrent of an oxide semiconductor film. The size of a measurement sample was L/W=30/100000 [μm]. A gate electrode was provided as in a thin film transistor. The measurement voltage was Vd=0.1 V. As a light source, light emitted from a xenon lamp was dispersed with a filter, so that irradiation was performed with light having a wavelength of 400 [nm] at an irradiation intensity of 3.5 [$mW/cm^2$]. B1500 manufactured by Agilent Technologies Inc. was used for the measurement. As the sequence of the measurement, light irradiation was performed for 600 seconds after 60 seconds have elapsed from the measurement start. After another 600 seconds have elapsed, a voltage of −20 V was applied to the gate electrode for 1 second. Lastly, after another 300 seconds have elapsed, a voltage of +20 V was applied to the gate electrode for 1 second. Current flowing in a drain electrode was continuously measured for 1800 seconds in total.

The measurement results in FIG. 17 show that, although relaxation of the photocurrent of the oxide semiconductor film is hardly observed at the time of applying a negative bias to the gate electrode, the current value drastically decreases by applying a positive bias. This suggests that trapped charge is released by the positive bias while charge remains trapped by the negative bias.

<Evaluation of Defect Level in Oxide Semiconductor Film>

From the above-described results of measuring photoresponse, it is suggested that a defect level exists in a band gap of the oxide semiconductor film. The defect level was evaluated by photo luminescence (PL) and a constant photo-current method (CPM) which are known as techniques for evaluating a level in a gap in amorphous silicon or the like. PL measurement was performed using a PL measurement apparatus manufactured by HORIBA, Ltd. (LabRAM HR-PL), with an excitation wavelength of 325 [nm] and a measurement temperature of 10 [K]. CPM measurement was performed using an apparatus adapted to a wide band-gap material. The apparatus manufactured with the cooperation of BUNKOUKEIKI Co., Ltd. was used. By the PL measurement, light emission due to a defect level can be observed. By the CPM measurement, light absorption due to a defect level can be observed.

Figure 18:
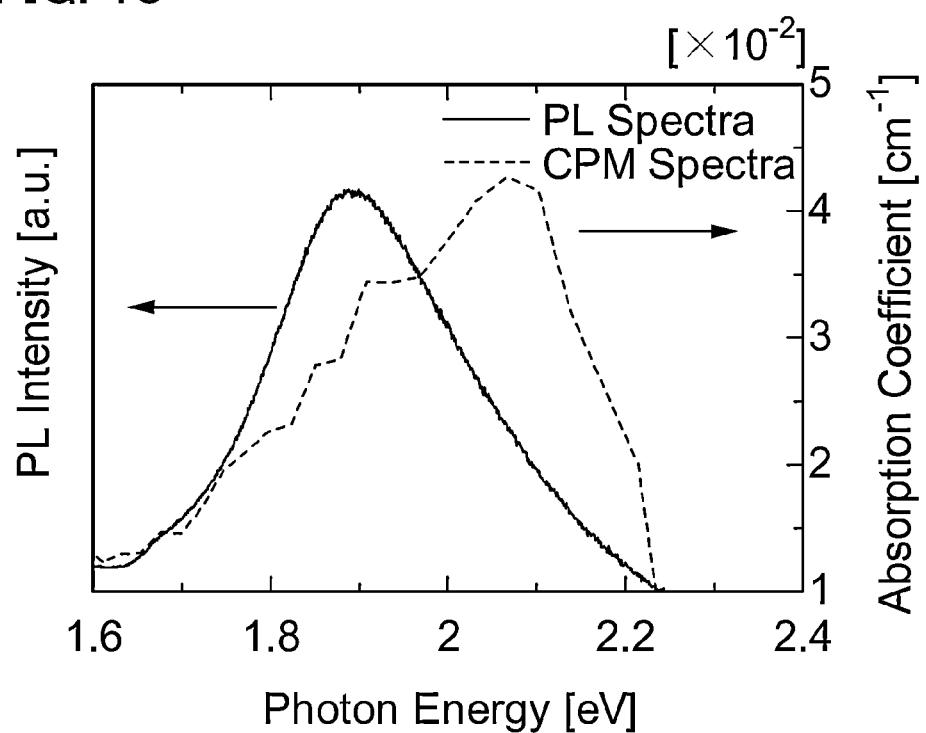
FIG. 18 shows a defect level of an oxide semiconductor film obtained by PL measurement and CPM measurement.

FIG. 18 shows peaks which are obtained by the PL measurement and the CPM measurement and are probably due to defect levels in a gap. Although the positions of the peaks are slightly different from each other, the widths of spectra thereof are almost the same; each peak has a width ranging from 1.5 eV to 2.3 eV. The peaks attributable to defect levels of oxygen vacancies are observed.

<Reduction in Defect Level by CAAC-OS Film>

Next, by CPM measurement, defect levels in a CAAC-OS film (also referred to as a CAAC-IGZO film) and an nc-OS film (also referred to as an nc-IGZO film or an nc-oxide semiconductor film) were compared to each other. The result thereof is described.

Figure 19:
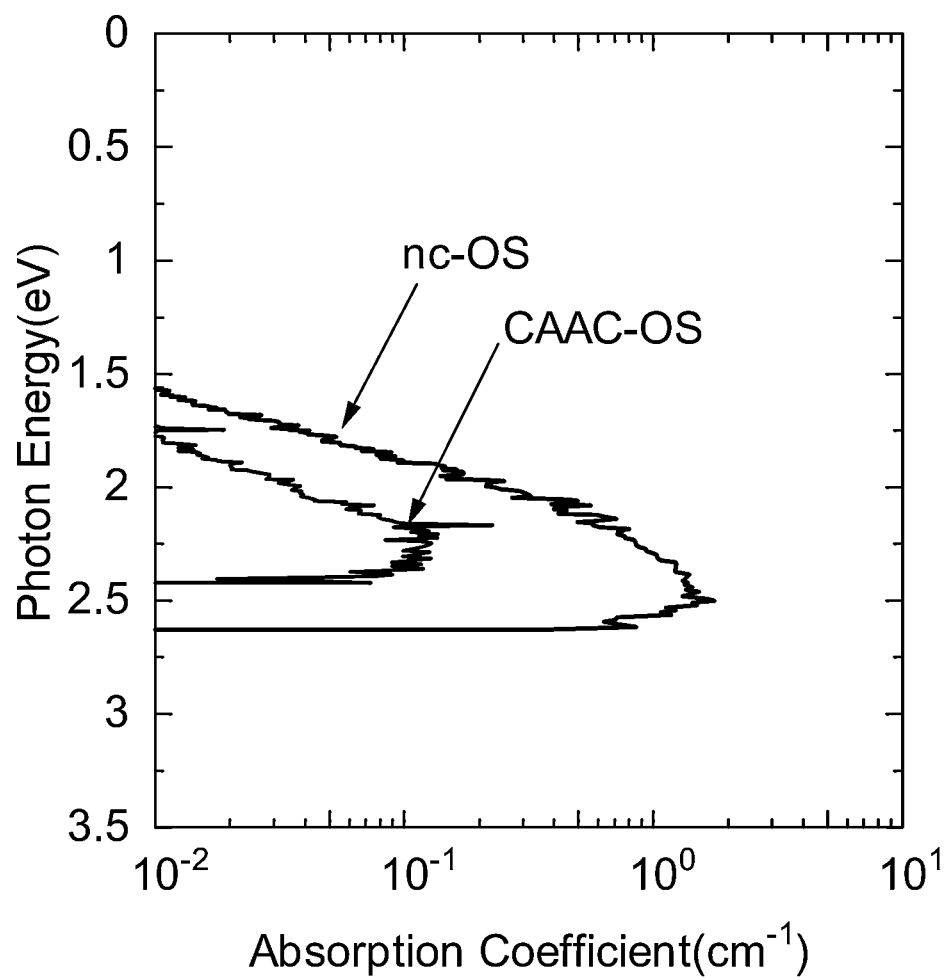
FIG. 19 shows the results of CPM measurement of a CAAC-OS film and an amorphous OS film.

FIG. 19 shows absorption spectra of defect levels obtained by CPM measurement. Table 1 shows comparison of absorption coefficients quantified from the measurement results by a formula (I) below. The results show that the absorption due to a defect level in a CAAC-IGZO is one or more digits smaller than that in an nc-IGZO, suggesting that the number of defects in the CAAC-IGZO is smaller than that in the nc-IGZO.

TABLE 1

|  | CAAC-OS | nc-OS |
| --- | --- | --- |
| Absorption Coefficient at the Sub-gap State [cm$^{-1}$] | $1.9 \times 10^{-2}$ | $2.6 \times 10^{-1}$ |

[Formula 1]

$$\alpha = \int \frac{(\alpha_{CPM} - \alpha_{UrbachTail})}{E} dE \quad (1)$$

α: Absorption coefficient in defect level
$\alpha_{CPM}$: Absorption coefficient obtained by CPM measurement
$\alpha_{UrbachTail}$: Absorption due to delocalized level Example 5

Model of Negative-bias Stress Photodegradation

It is probable that, in an actual thin film transistor, not only defect levels in an oxide semiconductor film but also those in a gate insulating film largely affect the characteristics of the thin film transistor. In general, a silicon oxide film or a silicon nitride film formed by a CVD method is used also in a thin film transistor including an oxide semiconductor film in a manner similar to that in a silicon device. The fundamental properties of an oxide semiconductor film were evaluated in Example 4. In this example, the following were considered: a defect level itself in a gate insulating film; and a band diagram when the gate insulating film was in contact with an oxide semiconductor film.

<Defect Level in Silicon Oxide>

Defect levels in silicon oxide are discussed in the research on silica glass for an optical fiber. Well-known defect levels in silicon oxide are an E' center and a non bridging oxygen hole center (NBOHC) (Non-patent Document 4: S. Munekuni et al., J. Appl. Phys. 68 1212 (1990)).

With a particular focus on the NBOHC, the level of NBOHC was calculated by first-principle calculation. NBOHC is generated by cutting a bond of hydrogen contained in silicon oxide. The calculation was performed using CASTEP, a first-principle calculation program using density functional theory (Accelrys Software Inc.). The conditions were as follows: a plane-wave basis; an ultrasoft pseudopotential; and a GGA-PBE functional.

Figure 20:
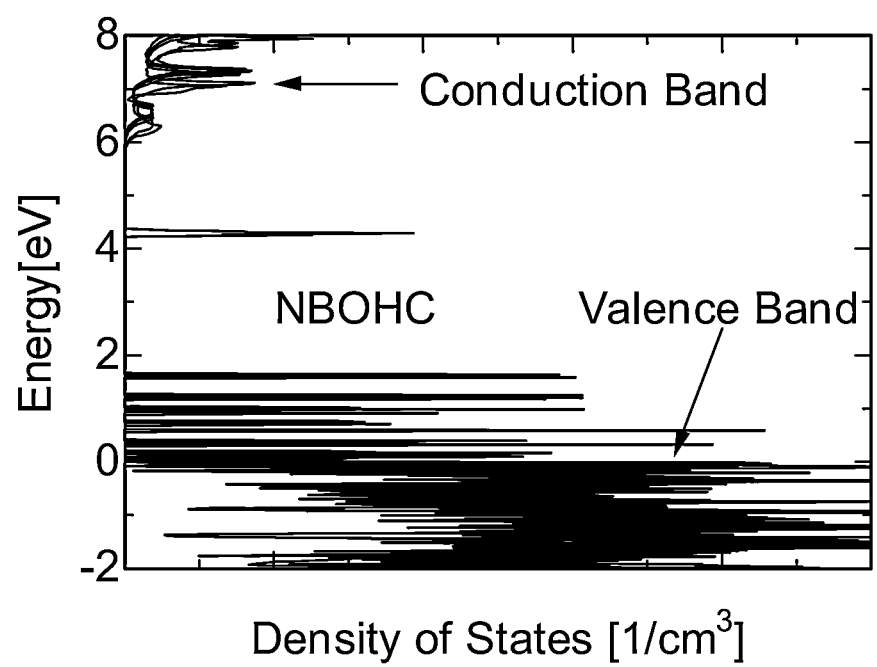
FIG. 20 shows a calculation result when NBOHC is introduced into silicon oxide.

FIG. 20 shows DOS of silicon oxide obtained by the calculation. The calculation results revealed that a defect level due to the above-described NBOHC is located at a deep level on the valence band side.

<Band Diagram of Oxide Semiconductor Film and Silicon Oxide Film>

Table 2 shows values of a band gap and an ionization potential of an oxide semiconductor film which were measured by ellipsometry and ultraviolet photoelectron spectroscopy (UPS).

TABLE 2

|  | Band Gap | Ionization Potential |
| --- | --- | --- |
| In—Ga—Zn—O | 3.1 eV | 7.8 eV |

Figure 21:
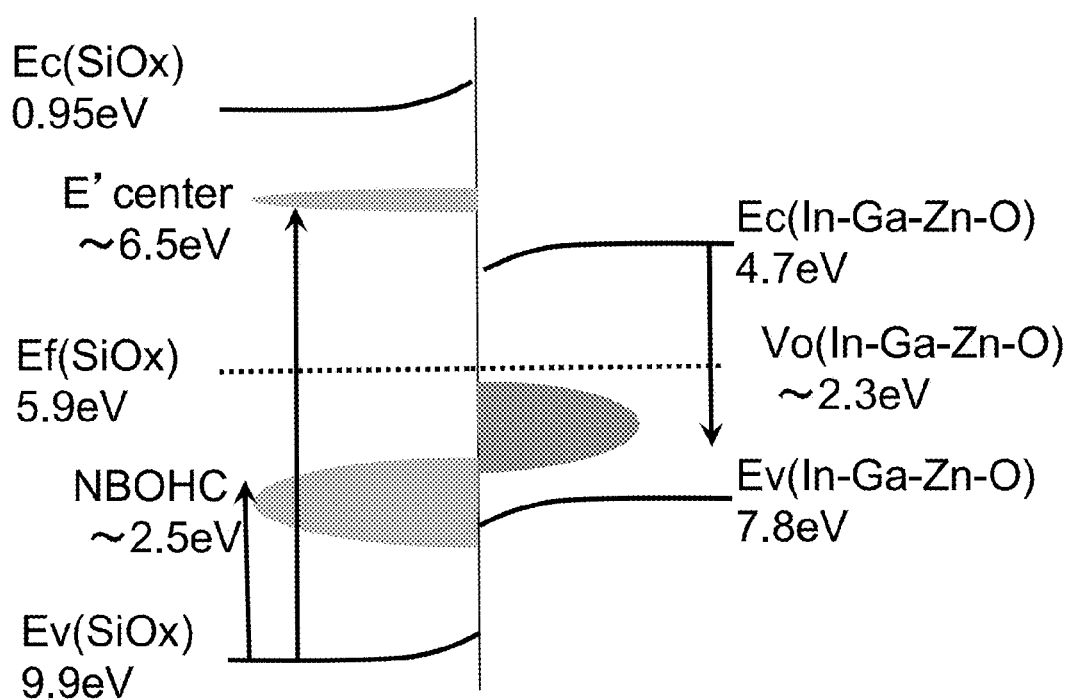
FIG. 21 is a band diagram of an oxide semiconductor film and silicon oxide to each of which a defect is introduced.

From the experimental values of the oxide semiconductor film and a calculation value and a literature value (Non-Patent Document 4: S. Munekuni et al., J. Appl. Phys. 68 1212 (1990)) of silicon oxide, band diagrams of the oxide semiconductor film and the silicon oxide were roughly estimated. FIG. 21 shows the results.

The oxygen vacancies (Vo) in the oxide semiconductor film obtained in Example 4 and the above-described defects in the silicon oxide are also shown in the diagram. Values of Ev and Ec in FIG. 21 are values of energy from a vacuum level. It is assumed that the Fermi level of each film is in the middle of the band gap when the films are in contact with each other. Practically, an oxide semiconductor film is likely to become an n-type oxide semiconductor film; hence, it is probable that the Fermi level of the oxide semiconductor film is on the conduction band side.

The defect levels of the oxide semiconductor film and the silicon oxide were estimated from the measurement results of a single film of the oxide semiconductor film and from the calculation results and the literature value of the silicon oxide. The thus estimated defect levels of the oxide semiconductor film and the silicon oxide are both in the deep positions of valence bands and the energy positions of the defect levels are very close to each other, as shown in the band diagram.

From the above-described measurement results and the band diagram based on the measurement results, the following model can be considered with respect to negative-bias stress photodegradation.

1. By light irradiation, electron-hole is generated in an oxide semiconductor film.
2. The generated hole is trapped in a deep defect level in the oxide semiconductor film which is derived from an oxygen vacancy.
3. By application of a negative bias, the trapped hole is injected into a defect level in a silicon oxide film which is derived from hydrogen.
4. The injected hole becomes a fixed charge having a positive charge in the silicon oxide film, thereby varying threshold voltage of a thin film transistor.

Example 6

Improvement of Negative-bias Stress Photodegradation

Possible causes regarding the model for negative-bias stress photodegradation in Example 5 are as follows:
1. Generation of holes by light irradiation
2. Defect levels in an oxide semiconductor film
3. Defect levels in a silicon oxide film
It seems that the threshold value of a thin film transistor is varied due to these elements intertwined with each other.

Figure 22A:
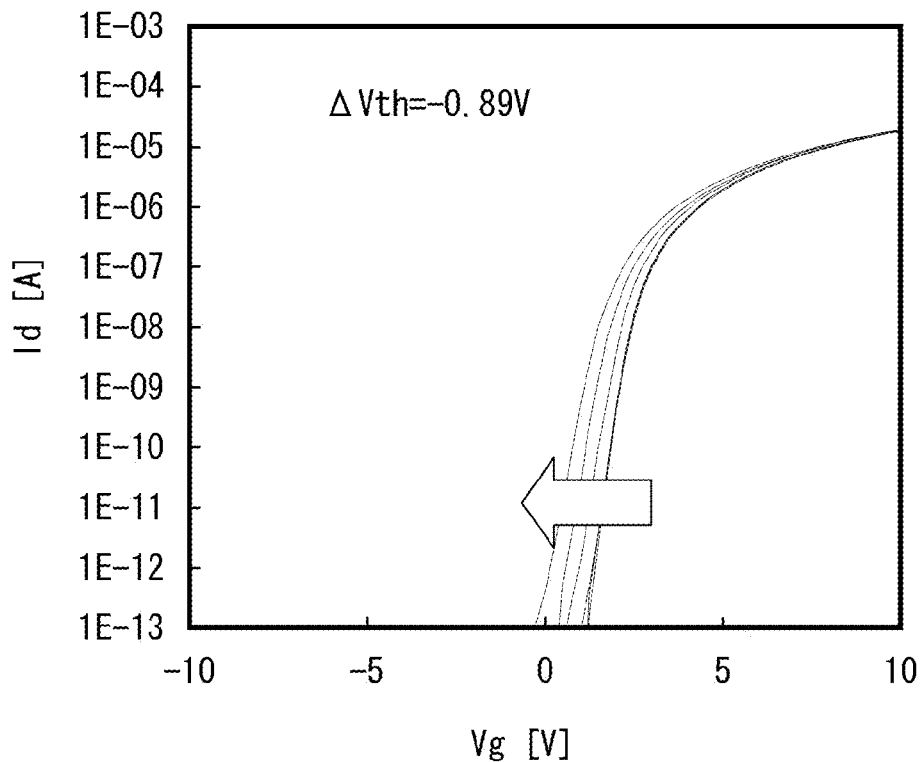
FIG. 22A shows Id-Vg characteristics of a sample having a gate insulating film in which hydrogen is not reduced.
Figure 22B:
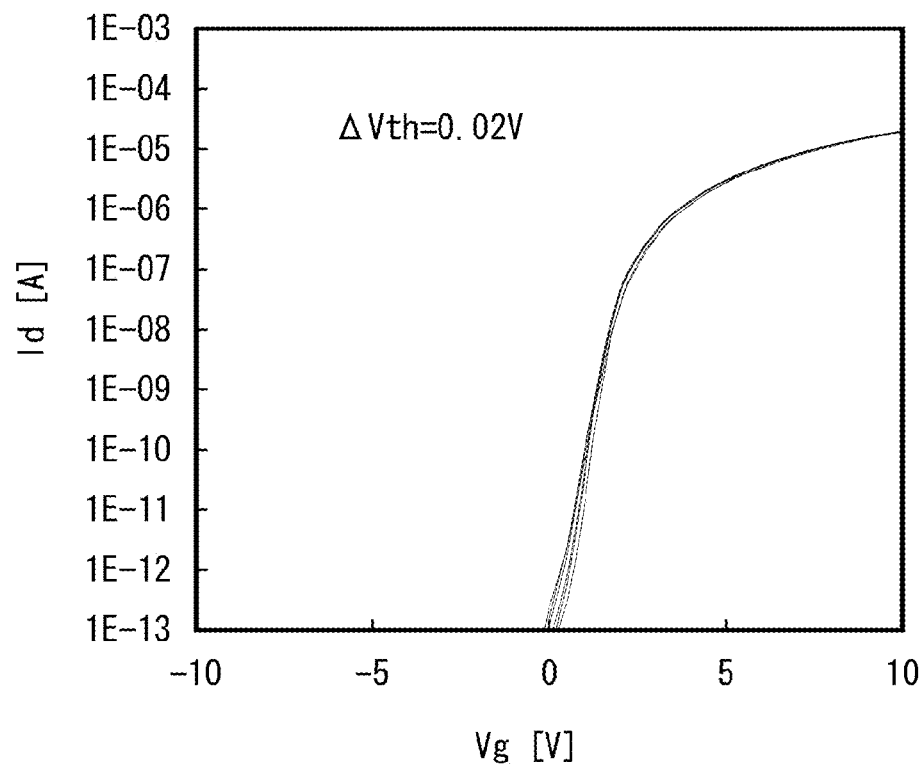
FIG. 22B shows Id-Vg characteristics of a sample having a gate insulating film in which hydrogen is reduced.

Thus, a CAAC-OS was used for the oxide semiconductor film, hydrogen in the silicon oxide film used as a gate insulating film is reduced, and an NBOHC for forming a deep level on the valence band side is reduced, whereby negative-bias stress photodegradation was successfully reduced. FIGS. 22A and 22B show the comparison between the result of measuring reliability of a sample having a gate insulating film in which hydrogen was reduced and the result of measuring reliability of a sample having a gate insulating film in which hydrogen was not reduced. FIG. 22A shows Id-Vg characteristics of a sample having a gate insulating film in which hydrogen was not reduced. FIG. 22B shows Id-Vg characteristics of a sample having a gate insulating film in which hydrogen was reduced by heat treatment.

As shown in FIG. 22B, in the sample having the gate insulating film in which hydrogen was reduced, the variation in threshold value is substantially zero under the following conditions: stress voltage VG=−30 V; stress temperature=80° C.; stress time=2000 sec; and illuminance=3000 [lx] with a white LED.

<Further Improvement in Reliability>

Figure 23A:
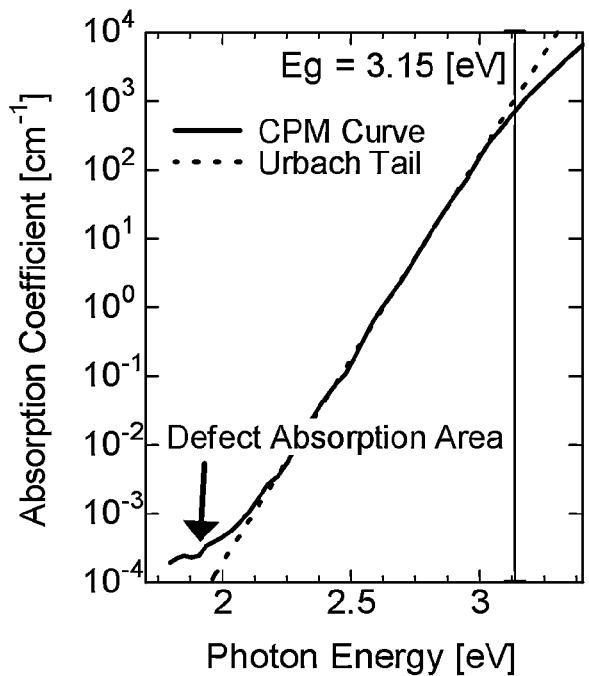
FIGS. 23A and 23B show the results of CPM measurement of an oxide semiconductor film in which oxygen vacancies are further reduced.
Figure 23B:
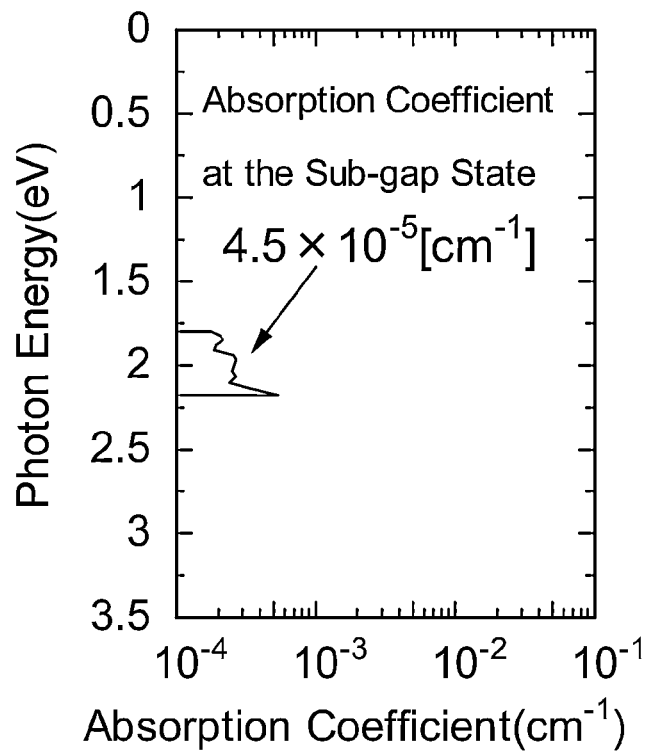

In the above-described CPM measurement, further reduction of absorption derived from a defect level was successfully made using a CAAC-OS at the level of evaluation using a single film. FIGS. 23A and 23B show the results of CPM measurement of an OS film in which oxygen vacancies were further reduced.

As in the results shown in FIGS. 23A and 23B, only absorption having a constant slope, which is called an urbach tail and due to a delocalized level, is observed in this oxide semiconductor film, and absorption due to a defect level which is slightly observed is $4.5 \times 10^{-5}$ [cm$^{-1}$], which is very small.

In such a sample in which defect levels in a band gap are greatly reduced, the negative-bias stress photodegradation can be reduced, and other characteristics including reliability can be improved.

<Highly Reliable AM-LCD Panel>

Figure 24:
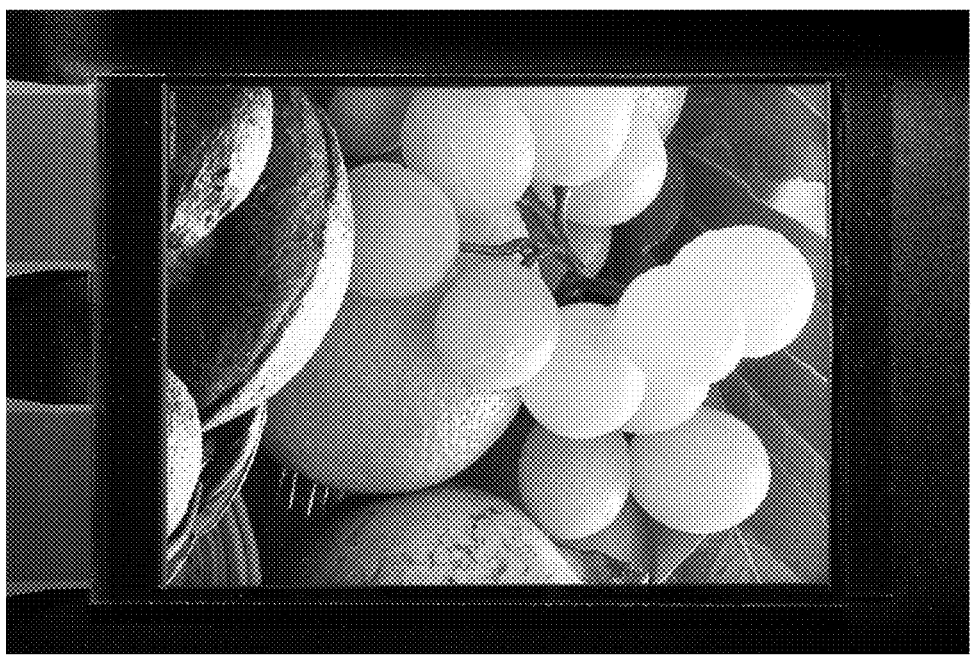
FIG. 24 is a photograph of an AM-LCD panel in which a CAAC-OS thin film transistor is used for a backplane.

FIG. 24 is a photograph of a highly reliable AM-LCD panel using a backplane including a thin film transistor having the above-described CAAC-OS.

Example 7

In this example, a defect level in a band gap of an oxide semiconductor film to which an impurity was introduced to the oxide semiconductor film by an ion implantation method was examined by hard X-ray photoelectron spectroscopy (HX-PES). The results are described.

The HX-PES was performed in a large synchrotron radiation facility (SPring-8). The energy of hard X-ray in the analysis was 7.94 keV, and the measurement resolution was 0.25 keV. Note that by normal photoelectron spectroscopy (PES), data of only a region ranging from a sample surface to a depth of about several nanometers is obtained, and thus, it is hard to obtain accurate data of the inside of the sample. In contrast, by the HX-PES, data of a region ranging from a sample surface to a depth of about several tens of nanometers can be detected. Thus, data of the inside of the sample can be obtained more accurately.

Specifically, by irradiating a sample with a high-energy X-ray, electrons in the sample were released as photoelectrons and the number of released photoelectrons and kinetic energy thereof were measured, whereby data of the inside of the sample can be obtained. As an example, a defect level in the sample can be found.

<Formation Conditions of Sample>

First, the formation conditions of a sample are described.

A silicon substrate having 5 inches on each side was used as a substrate.

An oxide semiconductor film (CAAC-OS) was formed to a thickness of 100 nm over the substrate. The oxide semiconductor film was formed by a sputtering method under the following conditions: a target where In:Ga:Zn=1:1:1 (atomic ratio) was used; the pressure was 0.4 Pa; the power was 0.5 kW; the flow rate was Ar:$O_2$=2:1 (volume ratio); and the substrate temperature was 300° C.

Then, a sample A was obtained by introducing hydrogen ($^1$H) as an impurity element into a sample having the above-described structure. A sample B was obtained by introducing argon (Ar) as an impurity element into a sample having the above-described structure. Another sample having the above-described structure into which no impurity was added is referred to as a sample C. Note that hydrogen was introduced by an ion implantation method at an acceleration voltage of 5 keV and a dosage of $1.0 \times 10^{16}$/cm$^2$, and argon was introduced by an ion implantation method at an acceleration voltage of 5 keV and a dosage of $1.0 \times 10^{15}$/cm$^2$.

<Result>

Figure 25A:
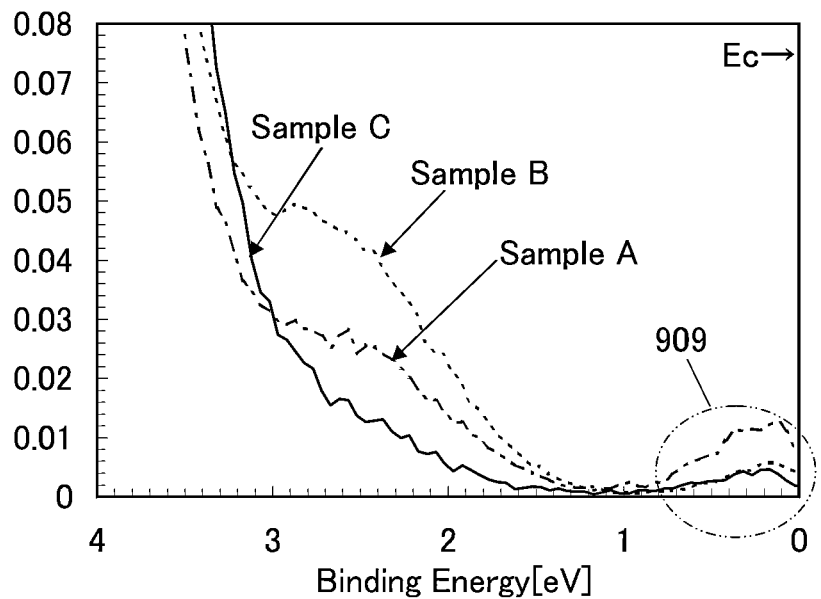
FIGS. 25A and 25B show results of examining a defect level in an oxide semiconductor film by HX-PES.

FIG. 25A shows the results of analyzing the samples A to C by the HX-PES. The horizontal axis in FIG. 25A indicates binding energy in a band gap, where energy at the lower end (Ec) of a conduction band is represented by 0. Obtained spectra are normalized with respect to the maximum value of the 2p orbit of an oxygen atom. A chart in which the range of binding energy from 0 eV to 4 eV is enlarged is shown in FIG. 25A.

FIG. 25A shows that, at around 2 eV to 3 eV, a signal from the sample A into which hydrogen was introduced and a signal from the sample B into which argon was introduced are increased as compared to a signal from the sample C into which no impurity was introduced. Since the band gap of the oxide semiconductor film is approximately 3.15 eV, signals detected at around 2 eV to 3 eV can be considered as orbits in the band gap, i.e., defect levels in the oxide semiconductor film. From this result, it is likely that defect levels at around 2 eV to 3 eV in the sample A and the sample B are increased by the introduction of the impurity using an ion implantation method.

On the other hand, at around 0.2 eV to 0.5 eV (in a region 909), a signal from the sample A is increased as compared to a signal from the sample C, but a signal from the sample B is almost the same as the signal from the sample C. This shows that shallow defect levels in the vicinity of Ec are much formed in the sample A.

Figure 25B:
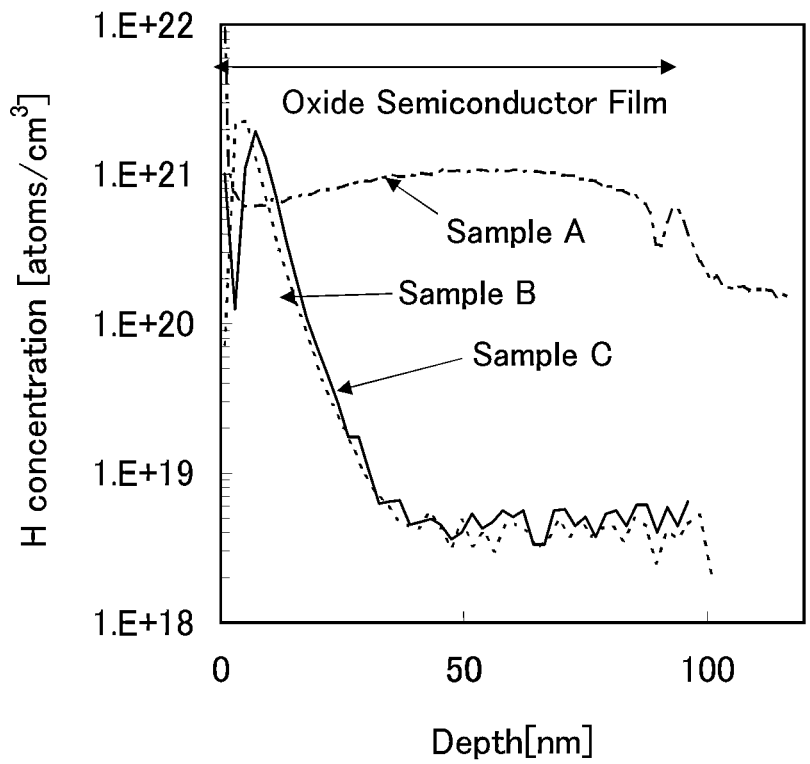

In order to clarify the cause of the shallow levels, SIMS analysis was performed on samples formed under the same conditions as the samples used for the HX-PES analysis to examine hydrogen concentration profiles in the depth direction of the oxide semiconductor films. FIG. 25B shows the results of analyzing the samples A to C by the SIMS. The horizontal axis in FIG. 25B indicates the depth from a sample surface, and the depth at 0 nm corresponds to a surface of the oxide semiconductor film. Hence, the depth from 0 nm to 100 nm corresponds to the oxide semiconductor film.

FIG. 25B shows that hydrogen exists at a concentration of approximately $1.0 \times 10^{21}$ atoms/cm$^3$ in the entire area of the oxide semiconductor film in the sample A. Since the hydrogen concentration profiles for the samples B and C almost coincide with each other, it is revealed that hydrogen was not introduced into the oxide semiconductor film when argon was introduced.

From FIGS. 25A and 25B, it is estimated that the signal detected by the HX-PES at around 2 eV to 3 eV from Ec is caused by an oxygen vacancy due to damage at the time of the ion implantation and that the density of defect states thereof is determined depending on the degree of the damage.

Further, as for the samples B and C, although hydrogen is contained at approximately $5 \times 10^{18}$ atoms/cm$^3$, the increased amount of the signal in the region 909 is small as compared to the sample A. In the region 909, the intensity of the signal detected from the sample A is higher than that from the sample B and the sample C. Thus, it is likely that an energy level at around 0.2 eV to 0.5 eV from Ec is caused by bonding of hydrogen to an oxygen vacancy portion generated in the oxide semiconductor film.

This application is based on Japanese Patent Application serial no. 2012-104858 filed with Japan Patent Office on May 1, 2012, Japanese Patent Application serial no. 2012-263065 filed with Japan Patent Office on Nov. 30, 2012, Japanese Patent Application serial no. 2013-023631 filed with Japan Patent Office on Feb. 8, 2013, and Japanese Patent Application serial no. 2013-051611 filed with Japan Patent Office on Mar. 14, 2013, the entire contents of which are hereby incorporated by reference.

What is claimed is:

1. A semiconductor device comprising:
    an insulating film;
    an oxide semiconductor film in contact with the insulating film and including a channel formation region provided between a source region and a drain region; and
    a gate electrode overlapping with the oxide semiconductor film with a gate insulating film provided therebetween,
    wherein, in at least one of the insulating film and the gate insulating film, a region overlapping with at least the source region and the drain region contains a higher proportion of hydrogen than a region overlapping with the channel formation region.

2. The semiconductor device according to claim 1,
    wherein, in at least one of the insulating film and the gate insulating film, the region overlapping with at least the source region and the drain region contains a higher proportion of impurity than the region overlapping with the channel formation region.

3. The semiconductor device according to claim 2,
    wherein the impurity is at least one kind selected from nitrogen (N), argon (Ar), carbon (C), phosphorus (P), and boron (B).

4. The semiconductor device according to claim 2,
    wherein, in at least one of the insulating film and the gate insulating film, an impurity concentration in the region overlapping with at least the source region and the drain region is higher than or equal to $10^{14}$ atoms/cm$^3$ and lower than or equal to $10^{22}$ atoms/cm$^3$.

5. The semiconductor device according to claim 2,
    wherein the source region and the drain region contain the impurity.

6. The semiconductor device according to claim 1,
    wherein a hydrogen concentration in the channel formation region of the oxide semiconductor film is lower than or equal to $5 \times 10^{18}$ atoms/cm$^3$.

7. The semiconductor device according to claim 1,
    wherein crystallinity of the source region and the drain region of the oxide semiconductor film is lower than crystallinity of the channel formation region.

8. A semiconductor device comprising:
    an insulating film;
    an oxide semiconductor film in contact with the insulating film and including a channel formation region provided between a source region and a drain region;
    a source electrode electrically connected to the source region, and a drain electrode electrically connected to the drain region;
    a gate insulating film over the oxide semiconductor film, the source electrode and the drain electrode; and
    a gate electrode overlapping with the oxide semiconductor film with the gate insulating film provided therebetween,
    wherein, in at least one of the insulating film and the gate insulating film, a region overlapping with at least the source region and the drain region contains a higher proportion of hydrogen than a region overlapping with the channel formation region.

9. The semiconductor device according to claim 8,
    wherein, in at least one of the insulating film and the gate insulating film, the region overlapping with at least the source region and the drain region contains a higher proportion of impurity than the region overlapping with the channel formation region.

10. The semiconductor device according to claim 9,
    wherein the impurity is at least one kind selected from nitrogen (N), argon (Ar), carbon (C), phosphorus (P), and boron (B).

11. The semiconductor device according to claim 9,
    wherein, in at least one of the insulating film and the gate insulating film, an impurity concentration in the region overlapping with at least the source region and the drain region is higher than or equal to $10^{14}$ atoms/cm$^3$ and lower than or equal to $10^{22}$ atoms/cm$^3$.

12. The semiconductor device according to claim 9,
    wherein the source region and the drain region contain the impurity.

13. The semiconductor device according to claim 8,
    wherein a hydrogen concentration in the channel formation region of the oxide semiconductor film is lower than or equal to $5 \times 10^{18}$ atoms/cm$^3$.

14. The semiconductor device according to claim 8,
    wherein crystallinity of the source region and the drain region of the oxide semiconductor film is lower than crystallinity of the channel formation region.

15. The semiconductor device according to claim 8,
    wherein the source electrode and the drain electrode are provided between the insulating film and the oxide semiconductor film.

16. The semiconductor device according to claim 8,
wherein the source electrode and the drain electrode are provided between the oxide semiconductor film and the gate insulating film.

17. The semiconductor device according to claim 8, further comprising a conductive layer,
wherein the insulating film is provided between the conductive layer and the oxide semiconductor film.

* * * * *